(12) United States Patent  
Chen et al.

(10) Patent No.: US 11,444,212 B2  
(45) Date of Patent: Sep. 13, 2022

(54) CRYSTALLINE SILICON SOLAR CELL AND PREPARATION METHOD THEREFOR, AND PHOTOVOLTAIC MODULE

(71) Applicant: JingAo Solar CO., LTD., Xingtai (CN)

(72) Inventors: Xiaoye Chen, Yangzhou (CN); Wenjuan Xue, Yangzhou (CN); Xiulin Jiang, Yangzhou (CN); Haipeng Yin, Yangzhou (CN)

(73) Assignee: JINGAO SOLAR CO., LTD., Xingtai (CN)

( * ) Notice: Subject to any disclaimer, the term of this patent is extended or adjusted under 35 U.S.C. 154(b) by 0 days.

(21) Appl. No.: 17/055,370

(22) PCT Filed: Jun. 21, 2019

(86) PCT No.: PCT/CN2019/092374  
§ 371 (c)(1),  
(2) Date: Nov. 13, 2020

(87) PCT Pub. No.: WO2019/242761  
PCT Pub. Date: Dec. 26, 2019

(65) Prior Publication Data  
US 2021/0217907 A1 Jul. 15, 2021

(30) Foreign Application Priority Data

Jun. 22, 2018 (CN) .......................... 201810649226.2  
Jun. 22, 2018 (CN) .......................... 201810649228.1  
Oct. 19, 2018 (CN) .......................... 201811223037.5

(51) Int. Cl.  
*H01L 31/0216* (2014.01)  
*H01L 31/0224* (2006.01)  
(Continued)

(52) U.S. Cl.  
CPC .. *H01L 31/02167* (2013.01); *H01L 31/02168* (2013.01); *H01L 31/022425* (2013.01);  
(Continued)

(58) Field of Classification Search  
CPC ......... H01L 31/02167; H01L 31/02168; H01L 31/022425; H01L 31/03685; H01L 31/068  
See application file for complete search history.

(56) References Cited

U.S. PATENT DOCUMENTS

2004/0171187 A1* 9/2004 Kataoka .................. H01L 31/18  
136/251  
2011/0303278 A1* 12/2011 Fu .................... H01L 31/022475  
257/E31.13  
(Continued)

FOREIGN PATENT DOCUMENTS

| CN | 104064606 A | 9/2014 |
| CN | 104471718 A | 3/2015 |

(Continued)

OTHER PUBLICATIONS

Examination report for Australian application No. 2019290813, report dated Aug. 27, 2021 (9 pages).

(Continued)

*Primary Examiner* — Golam Mowla  
(74) *Attorney, Agent, or Firm* — Abelman, Frayne & Schwab

(57) ABSTRACT

A crystalline silicon solar cell includes a gallium oxide layer in direct contact with a P-type silicon layer in the crystalline silicon solar cell. The gallium oxide layer is arranged on the P-type silicon layer of the crystalline silicon solar cell, negative charges of the gallium oxide layer are used to carry out chemical passivation and field passivation on a surface of the P-type silicon layer, and the number of dangling bonds and minority carriers of silicon atoms on the surface of the (Continued)

P-type silicon layer is reduced, so that a minority carrier recombination rate at the surface of the P-type silicon layer is reduced. In addition, the gallium oxide layer has a relatively wide band gap and an appropriate optical refractive index.

5 Claims, 4 Drawing Sheets

(51) Int. Cl.
    *H01L 31/0368*     (2006.01)
    *H01L 31/068*     (2012.01)

(52) U.S. Cl.
    CPC ...... *H01L 31/03685* (2013.01); *H01L 31/068* (2013.01); *Y02E 10/50* (2013.01)

(56) References Cited

U.S. PATENT DOCUMENTS

| | | | | |
|---|---|---|---|---|
| 2012/0024370 A1* | 2/2012 | Lee | ............... | H01L 31/02167 |
| | | | | 257/E31.13 |
| 2012/0097246 A1* | 4/2012 | Liu | ............... | H01L 31/1804 |
| | | | | 136/258 |
| 2013/0214271 A1* | 8/2013 | Asami | ............... | H01L 31/074 |
| | | | | 257/43 |
| 2014/0042440 A1* | 2/2014 | Sun | ............... | H01L 31/1868 |
| | | | | 438/782 |
| 2017/0236952 A1 | 8/2017 | Schultz-Wittmann et al. | | |

FOREIGN PATENT DOCUMENTS

| | | |
|---|---|---|
| CN | 107482079 A | 12/2017 |
| CN | 108767022 A | 11/2018 |
| CN | 109065639 A | 12/2018 |
| CN | 109494261 A | 3/2019 |
| DE | 102012214442 A1 | 2/2014 |
| DE | 102016207303 A1 | 11/2017 |

OTHER PUBLICATIONS

English translation of Int'l Search Report for PCT/CN2019/092374, dated Sep. 29, 2019 (3 pages).

* cited by examiner

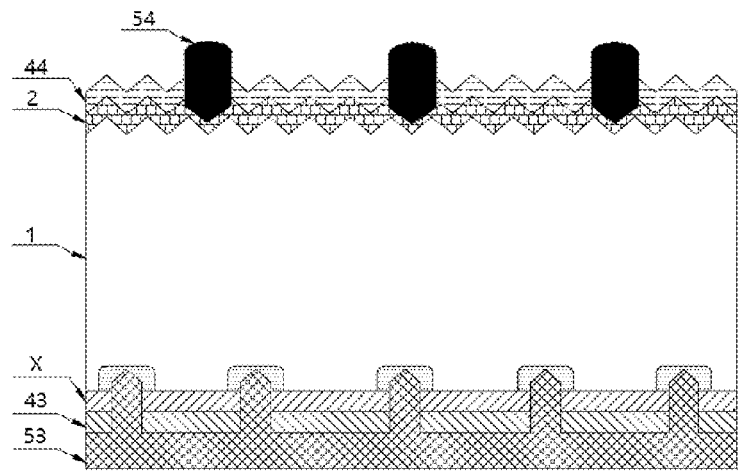
Fig. 4
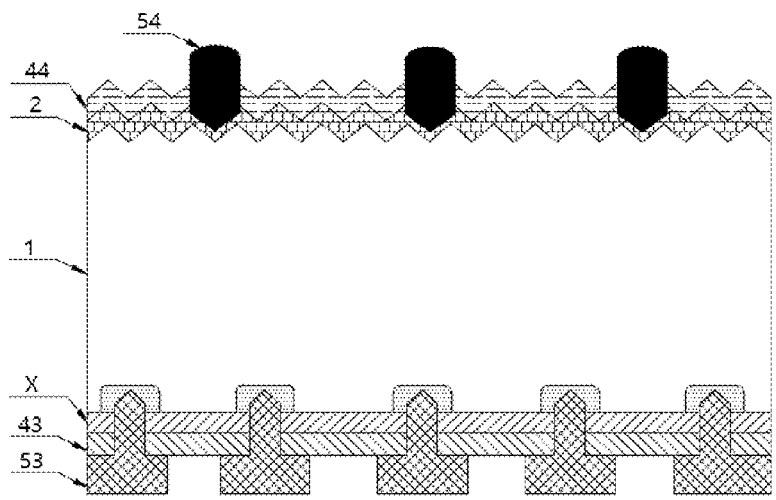
Fig. 5
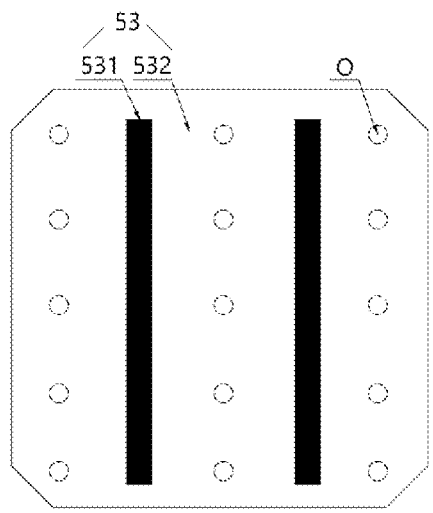 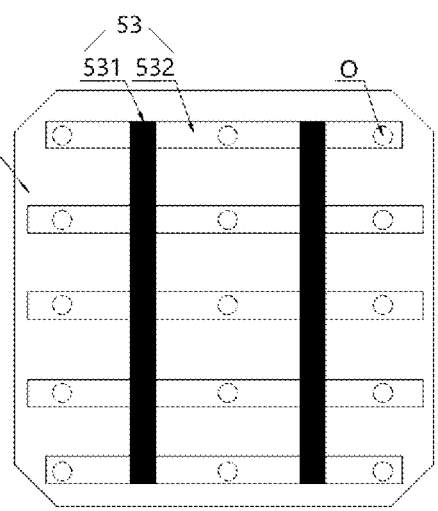
Fig. 6　　　　　　　　　　Fig. 7

CRYSTALLINE SILICON SOLAR CELL AND PREPARATION METHOD THEREFOR, AND PHOTOVOLTAIC MODULE

The present disclosure claims priorities of patent applications as follows: Chinese Patent Application No. 201810649226.2 filed to the National Intellectual Property Administration, PRC on Jun. 22, 2018, entitled "N-TYPE CRYSTALLINE SILICON SOLAR CELL AND PREPARATION METHOD, AND PHOTOVOLTAIC ASSEMBLY";

Chinese Patent Application No. 201810649228.1 filed to the National Intellectual Property Administration, PRC on Jun. 22, 2018, entitled "P-TYPE CRYSTALLINE SILICON SOLAR CELL AND PREPARATION METHOD, AND PHOTOVOLTAIC ASSEMBLY"; and Chinese Patent Application No. 201811223037.5 filed to the National Intellectual Property Administration, PRC on Oct. 19, 2018, entitled "SILICON-BASED SOLAR CELL AND PREPARATION METHOD, AND PHOTOVOLTAIC ASSEMBLY", the entire contents of which are incorporated herein by reference.

TECHNICAL FIELD

The present disclosure relates to the technical field of solar cells, and particularly relates to a crystalline silicon solar cell and a preparation method therefor, and a photovoltaic module.

BACKGROUND

Photovoltaic power generation, i.e., direct conversion from solar energy into electric energy, is a power generation mode which is clean, sustainable and relatively high in cost performance A crystalline silicon solar cell is an important component of a photovoltaic power generation system, and photovoltaic conversion efficiency of the crystalline silicon solar cell has important influence on output power and cost per kilowatt hour of electricity of photovoltaic power generation.

Generally speaking, the crystalline silicon solar cell mainly comprises a front electrode, a front passivation layer, an emitter, a crystalline silicon substrate, a back passivation layer and a back electrode disposed in sequence, wherein the crystalline silicon substrate may be classified into a P-type crystalline silicon substrate, or an N-type crystalline silicon substrate according to a conductivity type. Materials of the front passivation layer and the back passivation layer generally are a silicon oxide, a silicon carbide, a silicon nitride, a silicon oxynitride and the like.

A minority carrier recombination rate in an existing crystalline silicon solar cell is relatively high, resulting in that the photovoltaic conversion efficiency of the solar cell is limited.

SUMMARY

Embodiments of the present disclosure provide a crystalline silicon solar cell and a preparation method, which can solve the problem of relatively high minority carrier recombination rate in the above-mentioned crystalline silicon solar cell. The embodiments of the present disclosure further provide a photovoltaic module based on the crystalline silicon solar cell, and use of gallium oxide as a passivation substance or a passivation structure in the crystalline silicon solar cell.

Specifically, the following technical solutions are included.

In a first aspect, an embodiment of the present disclosure provides a crystalline silicon solar cell, including: a gallium oxide layer in direct contact with a P-type silicon layer in the crystalline silicon solar cell.

Optionally, the crystalline silicon solar cell includes: a crystalline silicon substrate having an N-type conductivity, and an emitter layer arranged on a surface of one side of the crystalline silicon substrate and having a P-type conductivity; and the gallium oxide layer is arranged on the emitter layer and is in direct contact with the emitter layer.

Optionally, the crystalline silicon solar cell further includes: a first covering layer arranged on the gallium oxide layer; a first electrode arranged on the first covering layer and in contact with the emitter layer; a surface field layer arranged on a surface of one side, opposite to the emitter layer, of the crystalline silicon substrate, and having an N-type conductivity; a second covering layer arranged on the surface field layer; and a second electrode arranged on the second covering layer and in contact with the surface field layer.

Optionally, the crystalline silicon solar cell further includes: a first covering layer arranged on the gallium oxide layer; a first electrode arranged on the first covering layer and in contact with the emitter layer; a tunneling passivation layer arranged on a surface of one side, opposite to the emitter layer, of the crystalline silicon substrate; a doped silicon layer arranged on the tunneling passivation layer and having an N-type conductivity; a second covering layer arranged on the doped silicon layer; and a second electrode arranged on the second covering layer and in contact with the doped silicon layer.

Optionally, the doped silicon layer covers a partial region of the tunneling passivation layer, and the second covering layer is also arranged at a region of the tunneling passivation layer where the doped silicon layer is not arranged.

Optionally, a thickness of the gallium oxide layer is 1-120 nm.

Optionally, the thickness of the gallium oxide layer is 10-60 nm.

Optionally, the thickness of the gallium oxide layer is 20-40 nm.

Optionally, the crystalline silicon solar cell includes: a crystalline silicon substrate having a P-type conductivity; and the gallium oxide layer is arranged on a surface of one side of the crystalline silicon substrate and is in direct contact with the crystalline silicon substrate.

Optionally, the crystalline silicon solar cell further includes: a third covering layer arranged on the gallium oxide layer; a third electrode arranged on the third covering layer and in contact with the crystalline silicon substrate; an emitter layer arranged on the surface of one side, opposite to the gallium oxide layer, of the crystalline silicon substrate, and having an N-type conductivity; a fourth covering layer arranged on the emitter layer; and a fourth electrode arranged on the fourth covering layer and in contact with the emitter layer.

Optionally, the crystalline silicon solar cell further includes: a third covering layer arranged on the gallium oxide layer; a third electrode arranged on the third covering layer and in contact with the crystalline silicon substrate; an emitter layer arranged on the surface of one side, opposite to the gallium oxide layer, of the crystalline silicon substrate, and having an N-type conductivity; a tunneling passivation layer arranged on the emitter layer; a doped silicon layer arranged on the tunneling passivation layer and having an N-type conductivity; a fourth covering layer arranged on the doped silicon layer; and a fourth electrode arranged on the fourth covering layer and in contact with the doped silicon layer.

Optionally, the doped silicon layer covers a partial region of the tunneling passivation layer, and the fourth covering layer is arranged at a region of the tunneling passivation layer where the doped silicon layer is not arranged.

Optionally, the gallium oxide layer and the third covering layer are correspondingly provided with via holes; and a surface field layer having a P-type conductivity is formed on the surface of the crystalline silicon substrate in a region corresponding to the via holes.

Optionally, the third electrode includes a first part and a second part, the first part is linear, the second part is disposed on the third covering layer in a region outside the first part, and the second part is in contact with the first part; and the second part is in contact with the crystalline silicon substrate through the via holes, and the surface field layer is formed on the surface of the crystalline silicon substrate in a region corresponding to the via holes.

Optionally, a thickness of the gallium oxide layer is 1-1,000 nm.

Optionally, the thickness of the gallium oxide layer is 2-150 nm.

Optionally, the thickness of the gallium oxide layer is 5-60 nm.

Optionally, the crystalline silicon solar cell includes: a crystalline silicon substrate having a P-type conductivity; a first tunneling passivation layer arranged on a surface of one side of the crystalline silicon substrate; a first doped silicon layer arranged on the first tunneling passivation layer and having a P-type conductivity; a gallium oxide layer arranged on the first doped silicon layer; a fifth covering layer arranged on the gallium oxide layer; and a fifth electrode arranged on the fifth covering layer and in contact with the first doped silicon layer.

Optionally, the first doped silicon layer covers a partial region of the first tunneling passivation layer, and the gallium oxide layer is arranged at a region of the first tunneling passivation layer where the first doped silicon layer is not arranged.

Optionally, the crystalline silicon solar cell further includes: an emitter layer arranged on the surface of one side, opposite to the first tunneling passivation layer, of the crystalline silicon substrate, and having an N-type conductivity; a sixth covering layer arranged on the emitter layer; and a sixth electrode arranged on the sixth covering layer and in contact with the emitter layer.

Optionally, the crystalline silicon solar cell further includes: an emitter layer arranged on the surface of one side, opposite to the first tunneling passivation layer, of the crystalline silicon substrate, and having an N-type conductivity; a second tunneling passivation layer arranged on the emitter layer; a second doped silicon layer arranged on the second tunneling passivation layer and having an N-type conductivity; a sixth covering layer arranged on the second doped silicon layer; and a sixth electrode arranged on the sixth covering layer and in contact with the second doped silicon layer.

Optionally, the second doped silicon layer covers a partial region of the second tunneling passivation layer, and the sixth covering layer is arranged at a region of the second tunneling passivation layer where the second doped silicon layer is not arranged.

Optionally, a thickness of the gallium oxide layer is 10-90 nm.

In a second aspect, an embodiment of the present disclosure provides a photovoltaic module. The photovoltaic module includes a cover plate, a first encapsulant film, a cell string, a second encapsulant film and a backplane arranged in sequence, the cell string includes a plurality of solar cells, and the solar cell is the above-mentioned crystalline silicon solar cell.

In a third aspect, an embodiment of the present disclosure provides a preparation method for a crystalline silicon solar cell. The preparation method includes: forming a gallium oxide layer in direct contact with a P-type silicon layer in the crystalline silicon solar cell.

In a fourth aspect, an embodiment of the present disclosure provides use of gallium oxide as a passivation substance or a passivation structure in a crystalline silicon solar cell.

Optionally, the gallium oxide is in direct contact with a P-type silicon layer of the crystalline silicon solar cell.

The technical solutions according to the embodiments of the present disclosure at least have the advantageous effects as follows:

in the present disclosure, the gallium oxide layer in direct contact with the P-type silicon layer is arranged on the P-type silicon layer of the crystalline silicon solar cell, negative charges of the gallium oxide layer are used to carry out chemical passivation and field passivation on the surface of the P-type silicon layer, and reduce the number of dangling bonds and minority carriers of silicon atoms on the surface of the P-type silicon layer, so that recombination rate of minority carriers at the surface of the P-type silicon layer is reduced, the voltage and current of the solar cell are improved, and photovoltaic conversion efficiency of the solar cell is improved, thus improving output power of the photovoltaic module, reducing cost per kilowatt hour of electricity and improving cost performance of photovoltaic power generation. In addition, the gallium oxide layer also has a relatively wide band gap and an appropriate optical refractive index, and also facilitates improvement of the performance of the crystalline silicon solar cell.

BRIEF DESCRIPTION OF THE DRAWINGS

In order to describe the technical solutions in the embodiments of the present disclosure more clearly, a simple introduction on the accompanying drawings which are needed in the description of the embodiments is given below.

FIG. 4 is a structural schematic diagram of a crystalline silicon solar cell including a crystalline silicon substrate having a P-type conductivity according to an embodiment of the present disclosure;

FIG. 5 is a structural schematic diagram of another crystalline silicon solar cell including a crystalline silicon substrate having a P-type conductivity according to an embodiment of the present disclosure;

FIG. 6 is a structural schematic diagram of an all-aluminum back-surface-field back electrode;

FIG. 7 is a structural schematic diagram of a partial-aluminum back-surface-field back electrode;

Figure 1:
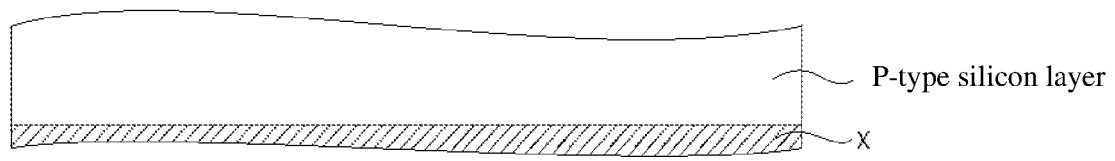
FIG. 1 is a structural schematic diagram of a crystalline silicon solar cell according to an embodiment of the present disclosure.

REFERENCE SIGNS IN THE ACCOMPANYING DRAWINGS RESPECTIVELY ARE 1 crystalline silicon substrate
2 emitter layer
3 surface field layer
41 first covering layer
42 second covering layer
43 third covering layer
44 fourth covering layer
45 fifth covering layer
46 sixth covering layer
51 first electrode
52 second electrode
53 third electrode
531 a first part of third electrode
532 a second part of third electrode
54 fourth electrode
55 fifth electrode
56 sixth electrode
6 tunneling passivation layer
61 first tunneling passivation layer
62 second tunneling passivation layer
7 doped silicon layer
71 first doped silicon layer
72 second doped silicon layer
X gallium oxide layer
O via hole

DETAILED DESCRIPTION

To make the technical solutions and advantages of the present disclosure clearer, the embodiments of the present disclosure will be further described in detail below in combination with the accompanying drawings.

Unless otherwise defined, the technical terms used in the embodiments of the present disclosure should be of general meaning as understood by those skilled in the art.

Improving photovoltaic conversion efficiency of a crystalline silicon solar cell is an effective approach of improving output power of photovoltaic power generation and reducing cost per kilowatt hour of electricity. Currently, one of important factors of limiting the photovoltaic conversion efficiency of one single crystalline silicon solar cell is recombination annihilation of minority carriers in the solar cell. Recombination annihilation of the minority carriers may cause loss of the voltage and current of the solar cell, thereby reducing the photovoltaic conversion efficiency of the cell. There are a great amount of unsaturated dangling bonds on a surface of crystalline silicon, which are very sevious recombination centers. A passivation layer is arranged on a surface of a silicon wafer to passivate the surface of the silicon wafer, so that a recombination probability of the minority carriers on the surface of the silicon wafer can be reduced, thereby facilitating improvement of the photovoltaic conversion efficiency of the solar cell.

Based on the above, the embodiments of the present disclosure provide a crystalline silicon solar cell using gallium oxide ($GaO_x$) to passivate a surface of a P-type silicon layer and a preparation method therefor, meanwhile, further provide a photovoltaic module based on the crystalline silicon solar cell and use of the gallium oxide as a passivation substance or a passivation structure in the crystalline silicon solar cell.

FIG. 1 shows a structure of a crystalline silicon solar cell according to an embodiment of the present disclosure, and as shown in FIG. 1, the crystalline silicon solar cell according to the embodiment of the present disclosure includes a gallium oxide layer X in direct contact with a P-type silicon layer in the crystalline silicon solar cell.

The gallium oxide layer X carries negative charges, and can chemically passivate and field passivate a surface of the P-type silicon layer, and thus, the gallium oxide layer X in direct contact with the P-type silicon layer is arranged on the surface of the P-type silicon layer, which can effectively reduce the number of dangling bonds and minority carriers of silicon atoms on the surface of the P-type silicon layer, and reduce recombination rate of minority carriers at the surface of the P-type silicon layer, so that the voltage and current of the solar cell are improved, and photovoltaic conversion efficiency of the solar cell is improved, thereby improving output power of the photovoltaic module, reducing cost per kilowatt hour of electricity and improving cost performance of photovoltaic power generation. In addition, the gallium oxide layer X also has a relatively wide band gap and an appropriate optical refractive index, and also facilitates improvement of the performance of the crystalline silicon solar cell.

An embodiment of the present disclosure further provides a preparation method for the above-mentioned crystalline silicon solar cell, particularly including a step of forming a gallium oxide layer X in direct contact with a P-type silicon layer in the crystalline silicon solar cell.

For crystalline silicon solar cells having different structures, gallium oxide layers X thereof are also different in arrangement position and thickness. A structure of the crystalline silicon solar cell and the preparation method for according to the embodiments of the present disclosure, will be further illustrated below in combination with a specific structure of the crystalline silicon solar cell.

Terms such as "first", "second", "third", "fourth", "fifth", "sixth" and the like used in the following description do not denote any order, quantity, or importance, but are only used for distinguishing different components for easy description.

First Optional Embodiment

Figure 2:
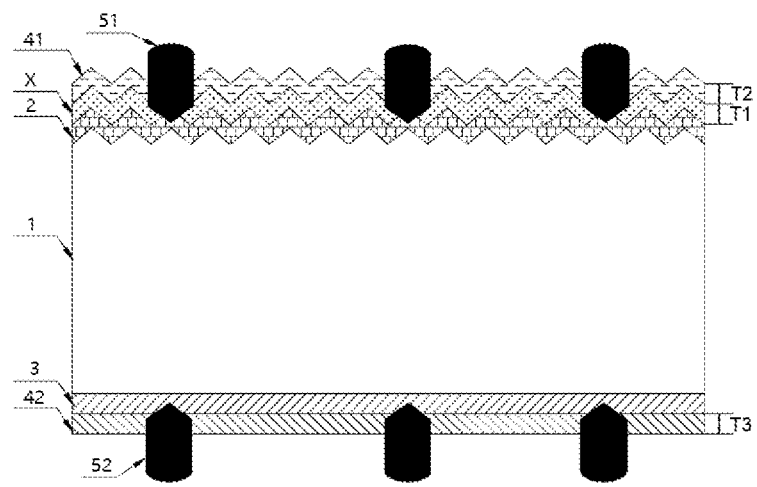
FIG. 2 is a structural schematic diagram of a crystalline silicon solar cell including a crystalline silicon substrate having an N-type conductivity according to an embodiment of the present disclosure.

FIG. 2 shows a structure of a crystalline silicon solar cell including an N-type crystalline silicon substrate, and as shown in FIG. 2, the crystalline silicon solar cell according to the embodiment includes:

a crystalline silicon substrate 1 having an N-type conductivity, an emitter layer 2 arranged on a surface of one side of the crystalline silicon substrate 1 and having a P-type conductivity, a gallium oxide layer X arranged on the emitter layer 2 and in direct contact with the emitter layer 2, a first covering layer 41 arranged on the gallium oxide layer X, a first electrode 51 arranged on the first covering layer 41 and in contact with the emitter layer 2, a surface field layer 3 arranged on a surface of one side, opposite to the emitter layer 2, of the crystalline silicon substrate 1, and having an N-type conductivity, a second covering layer 42 arranged on the surface field layer 3, and a second electrode 52 arranged on the second covering layer 42 and in contact with the surface field layer 3.

For the crystalline silicon solar cell according to the embodiment, a P-type silicon layer thereof is the emitter layer 2 arranged on the surface of one side of the N-type crystalline silicon substrate 1 and having the P-type conductivity, and thus, in the embodiment, the gallium oxide layer X is arranged on the emitter layer 2.

In the embodiment, the N-type crystalline silicon substrate 1 may be monocrystalline silicon, or polycrystalline silicon, and may be have a resistivity of 0.1-10 Ω·cm (e.g., 0.1 Ω·cm, 0.2 Ω·cm, 0.3 Ω·cm, 0.4 Ω·cm, 0.5 Ω·cm, 0.6 Ω·cm, 0.7 Ω·cm, 0.8 Ω·cm, 0.9 Ω·cm, 1 Ω·cm, 2 Ω·cm, 3 Ω·cm, 4 Ω·cm, 5 Ω·cm, 6 Ω·cm, 7 Ω·cm, 8 Ω·cm, 9 Ω·cm, 10 Ω·cm and the like).

The emitter layer 2 may be located on a front surface (i.e., a light receiving surface) of the crystalline silicon substrate 1, or on a back surface (i.e., a shady surface) of the crystalline silicon substrate 1, and correspondingly, the surface field layer 3 may be located on the back surface of the crystalline silicon substrate 1, or on the front surface of the crystalline silicon substrate 1.

The emitter layer 2 can be obtained by doping the N-type crystalline silicon substrate 1 with a P-type doping element (usually a group III element, including but not limited to boron), and its sheet resistance value may be 40-200Ω/□ (e.g., 40 Ω/□, 50 Ω/□, 60 Ω/□, 70 Ω/□, 80 Ω/□, 90 Ω/□, 100 Ω/□, 110 Ω/□, 120 Ω/□, 130 Ω/□, 140 Ω/□, 150 Ω/□, 160 Ω/□, 170 Ω/□, 180 Ω/□, 190 Ω/□, 200Ω/□ and the like).

The surface field layer 3 can be obtained by doping the N-type crystalline silicon substrate 1 with an N-type doping element (usually a group V element, including but not limited to phosphorus), and its sheet resistance value may be 20-500Ω/□, e.g., 20 Ω/□, 30 Ω/□, 40 Ω/□, 50 Ω/□, 60 Ω/□, 70 Ω/□, 80 Ω/□, 90 Ω/□, 100 Ω/□, 150 Ω/□, 200 Ω/□, 250 Ω/□, 300 Ω/□, 350 Ω/□, 400 Ω/□, 450 Ω/□, 500Ω/□ and the like.

Further, in the embodiment, a thickness (i.e., a size indicated by T1 in FIG. 2) of the gallium oxide layer X may be 1-120 nm, e.g., 1 nm, 2 nm, 3 nm, 4 nm, 5 nm, 6 nm 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm and the like. Preferably, the thickness of the gallium oxide layer X may be 10-60 nm; and more preferably, the thickness of the gallium oxide layer X may be 20-40 nm.

The first covering layer 41 may include at least one of a silicon nitride ($SiN_x$) layer, a silicon oxynitride ($SiO_xN_y$) layer, a silicon oxide ($SiO_x$) layer and a silicon carbide ($SiC_x$) layer, i.e., may be a single silicon nitride layer, a single silicon oxynitride layer, a single silicon oxide layer or a single silicon carbide layer, or may be a lamination of two or more of the silicon nitride layer, the silicon oxynitride layer, the silicon oxide layer and the silicon carbide layer. An overall thickness (i.e., a thickness indicated by T2 in FIG. 2) of the first covering layer 41 may be 10-120 nm, e.g., 10 nm, 15 nm, 20 nm, 25 nm, 30 nm, 35 nm, 40 nm, 45 nm, 50 nm, 60 nm, 65 nm, 70 nm, 75 nm, 80 nm, 85 nm, 90 nm, 95 nm, 100 nm, 105 nm, 110 nm, 115 nm, 120 nm and the like. When the first covering layer 41 adopts a lamination structure, there is no strict requirement on a thickness of each layer, and the thickness of each layer can be set as required, as long as the overall thickness meets the requirement.

The second covering layer 42 includes at least one of a silicon nitride layer, a silicon oxynitride layer, a silicon oxide layer and a silicon carbide layer, i.e., the second covering layer 42 may be a single silicon nitride layer, a single silicon oxynitride layer, a single silicon oxide layer and a single silicon carbide layer, or may be a lamination of two or more of the silicon nitride layer, the silicon oxynitride layer, the silicon oxide layer and the silicon carbide layer. An overall thickness (i.e., a size indicated by T3 in FIG. 2) of the second covering layer 42 may be 30-200 nm, e.g., 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm and 135 nm. When the second covering layer 42 adopts a lamination structure, there is no strict requirement on a thickness of each layer, and the thickness of each layer can be set as required, as long as the overall thickness meets the requirement.

The first electrode 51 and the second electrode 52 may be metal electrodes (e.g., silver electrodes), and correspondingly, the contact between the first electrode 51 and the emitter layer 2 is an ohmic contact, and the contact between the second electrode 52 and the surface field layer 3 is an ohmic contact.

Both the first electrode 51 and the second electrode 52 can adopt an electrode with a gate line structure (including a main gate line and a sub-gate line), thereby implementing double-sided power generation. In addition, a sheet resistance value of the region, corresponding to the first electrode 51, of the emitter layer 2 may be greater than the sheet resistance value of other regions (i.e., selective emitter), and a sheet resistance value of the region, corresponding to the second electrode 52, of the surface field layer 3 may also be greater than the sheet resistance value of other regions (i.e., selective surface field), thereby improving the photovoltaic conversion efficiency of the crystalline silicon solar cell.

A preparation method for a crystalline silicon solar cell according to the embodiment, mainly includes steps of cleaning and texturing a front surface of a crystalline silicon substrate 1, forming an emitter layer 2, flattening a back surface of the crystalline silicon substrate 1, forming a surface field layer 3, forming a gallium oxide layer X, forming a first covering layer 41 and a second covering layer 42, forming a first electrode 51 and a second electrode 52 and the like.

By cleaning and texturing the front surface of the crystalline silicon substrate 1, reflectivity can be reduced. The crystalline silicon substrate 1 can be cleaned by a mixed aqueous solution of sodium hydroxide (NaOH) and hydrogen peroxide ($H_2O_2$) so as to remove surface pollutants and a damaged layer. Texturing can be carried out by an alkali corrosion solution or an acid corrosion solution, and the alkali corrosion solution may be an aqueous solution of sodium hydroxide.

For an N-type crystalline silicon substrate 1, after texturing, reflectivity of a surface of a monocrystalline silicon wafer may be 10%-18% (e.g., 10%, 11%, 12%, 13%, 14%, 15%, 16%, 17%, 18% and the like), reflectivity of a surface of a polycrystalline silicon wafer may be 6% to 20% (e.g., 6%, 7%, 8%, 9%, 10%, 11%, 12%, 13%, 14%, 15%, 16%, 17%, 18%, 19%, 20% and the like).

The emitter layer 2 may be formed by methods of diffusing (e.g., furnace tube boron diffusion), depositing a doped layer containing a doping source (e.g., Borosilicate Glass (BSG)) and annealing, or of ion implanting (e.g., implanting boron ions) and annealing and the like.

The back surface of the crystalline silicon substrate 1 can be flattened by a chemical solution so as to appropriately reduce a specific surface area of the back surface of the crystalline silicon substrate 1, and then the crystalline silicon substrate is cleaned with hydrofluoric acid (e.g., an aqueous solution of HF), wherein the chemical solution may be an alkali solution including, but not limited to, a tetramethylammonium hydroxide (TMAH) solution, a sodium hydroxide (NaOH) solution, a potassium hydroxide (KOH) solution and the like, and concentration of the alkali solution can be adjusted as required; and the chemical solution may also be an acid solution, e.g., a mixed solution of nitric acid ($HNO_3$), hydrogen fluoride (HF) and sulfuric acid ($H_2SO_4$), and the concentration of each acid solution and the ratio of each acid solution in the mixed solution can also be adjusted as required.

The surface field layer 3 may be formed by methods of diffusing (e.g., furnace tube phosphorus diffusion), depositing a doped layer containing a doping source (e.g., phosphorosilicate glass PSG) and annealing, or of ion implanting (e.g., implanting phosphorus ions) and annealing, and the like.

The gallium oxide layer X may be formed by Atomic Layer Deposition (ALD), Plasma Enhanced Chemical Vapor Deposition (PECVD), Atmospheric Chemical Vapor Deposition (APCVD) or Low Pressure Chemical Vapor Deposition (LPCVD). After the gallium oxide layer X is deposited, an annealing step may also be carried out.

The first covering layer 41 and the second covering layer 42 may also be formed by ALD, PECVD, APCVD, LPCVD and the like. When the first covering layer 41 and the second covering layer 42 have the same composition, they can be simultaneously formed.

The first electrode 51 and the second electrode 52 may be formed by a method of screen printing electrode paste and rapidly high-temperature sintering. A sintering temperature may be 600-900° C. (e.g., 600° C., 650° C., 700° C., 750° C., 800° C., 850° C., 900° C. and the like), and the sintering time may be 10 seconds to 3 minutes, e.g., 10 seconds, 20 seconds, 30 seconds, 40 seconds, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds and the like.

Second Optional Embodiment

Figure 3:
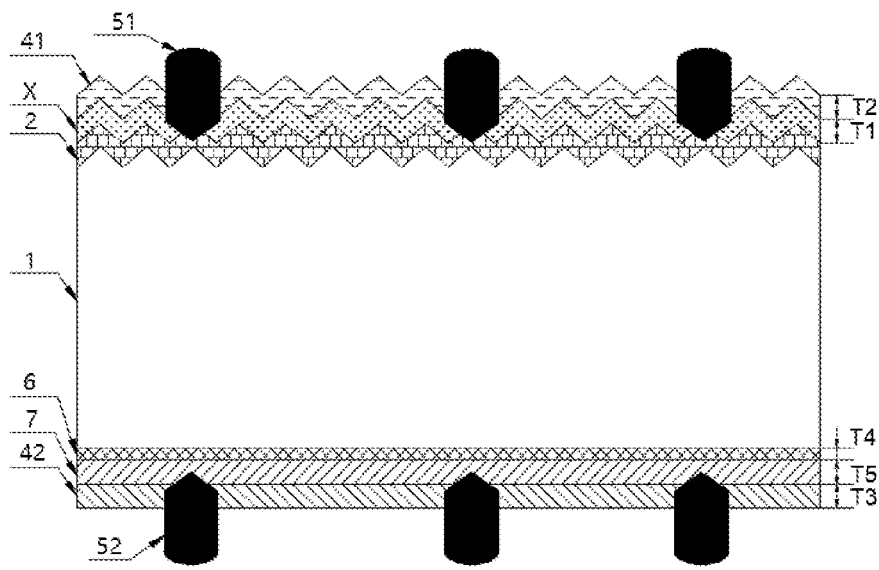
FIG. 3 is a structural schematic diagram of another crystalline silicon solar cell including a crystalline silicon substrate having an N-type conductivity according to an embodiment of the present disclosure.

FIG. 3 shows a structure of another crystalline silicon solar cell including an N-type crystalline silicon substrate, and as shown in FIG. 3, the crystalline silicon solar cell according to the embodiment, is based on a Tunnel Oxide Passivated Contact (TOP-Con) structure, and specifically includes:

a crystalline silicon substrate 1 having an N-type conductivity, an emitter layer 2 arranged on a surface of one side of the crystalline silicon substrate 1 and having a P-type conductivity, a gallium oxide layer X arranged on the emitter layer 2 and in direct contact with the emitter layer 2, a first covering layer 41 arranged on the gallium oxide layer X, a first electrode 51 arranged on the first covering layer 41 and in contact with the emitter layer 2, a tunneling passivation layer 6 arranged on a surface of one side, opposite to the emitter layer 2, of the crystalline silicon substrate 1, a doped silicon layer 7 arranged on the tunneling passivation layer 6 and having an N-type conductivity, a second covering layer 42 arranged on the doped silicon layer 7, and a second electrode 52 arranged on the second covering layer 42 and in contact with the doped silicon layer 7.

For the crystalline silicon solar cell according to the embodiment, a P-type silicon layer thereof is the emitter layer 2 arranged on the surface of one side of the N-type crystalline silicon substrate 1 and having the P-type conductivity, and thus, in the embodiment, the gallium oxide layer X is also arranged on the emitter layer 2.

In the embodiment, resistivity of the crystalline silicon substrate 1, a sheet resistance value of the emitter layer 2, a thickness of the gallium oxide layer X, a composition and a thickness of the first covering layer 41, and specific forms of the first electrode 51 and the second electrode 52 can refer to description in the first optional embodiment, and are not repeated herein.

In the embodiment, the doped silicon layer 7 specifically may be a doped polycrystalline silicon layer or a doped amorphous silicon layer, or a mixed layer of polycrystalline silicon and amorphous silicon. A doping source of the doped silicon layer 7 may be a group V element (including, but not limited to, phosphorus). A sheet resistance value of the doped silicon layer 7 may be 10-1,000Ω/□, e.g., 10 Ω/□, 20 Ω/□, 30 Ω/□, 40 Ω/□, 50 Ω/□, 60 Ω/□, 70 Ω/□, 80 Ω/□, 90 Ω/□, 100 Ω/□, 150 Ω/□, 200 Ω/□, 250 Ω/□, 300 Ω/□, 350 Ω/□, 400 Ω/□, 450 Ω/□, 500 Ω/□, 550 Ω/□, 600 Ω/□, 650 Ω/□, 700 Ω/□, 750 Ω/□, 800 Ω/□, 850 Ω/□, 900 Ω/□, 950 Ω/□, 1,000Ω/□ and the like. A thickness (i.e., a size indicated by T5 in FIG. 3) of the doped silicon layer 7 may be 10-1,000 nm, e.g., 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 750 nm, 800 nm, 850 nm, 900 nm, 950 nm, 1,000 nm and the like.

Correspondingly, the tunneling passivation layer 6 may be an electronic tunneling passivation layer, and has a certain blocking effect on diffusion of the group V element at a high temperature, that is to say, at the high temperature, a diffusion rate of the group V element in the tunneling passivation layer is much smaller than a diffusion rate of the group V element in the doped silicon layer 7. The tunneling passivation layer 6 may be an oxide, e.g., at least one of a silicon oxide ($SiO_x$) layer, a titanium oxide ($TiO_x$) layer, an aluminum oxide ($AlO_x$) layer, a tantalum oxide ($TaO_x$), a silicon oxynitride ($SiN_xO_y$) and the like, i.e., the tunneling passivation layer 6 may be a certain single oxide layer, or may be a lamination structure of various oxide layers. A thickness (i.e., a size indicated by T4 in FIG. 3) of the tunneling passivation layer 6 may be 0.5-6 nm, e.g., 0.5 nm, 0.6 nm, 0.7 nm, 0.8 nm, 0.9 nm, 1 nm, 1.5 nm, 2 nm, 2.5 nm, 3 nm, 3.5 nm, 4 nm, 4.5 nm, 5 nm, 5.5 nm, 6 nm and the like.

In the embodiment, the second covering layer 42 may include at least one of a silicon nitride layer, a silicon oxynitride layer, a silicon oxide layer and a silicon carbide layer, i.e., the second covering layer 42 may be a single silicon nitride layer, a single silicon oxynitride layer, a single silicon oxide layer or a single silicon carbide layer, and may also be a lamination of two or more of the silicon nitride layer, the silicon oxynitride layer, the silicon oxide layer and the silicon carbide layer. A thickness of the second covering layer 42 may be 60-120 nm (e.g., 60 nm, 65 nm, 70 nm, 75 nm, 80 nm, 85 nm, 90 nm, 95 nm, 100 nm, 105 nm, 110 nm, 115 nm, 120 nm and the like). When the second covering layer 42 has a lamination structure, there is no strict limitation to a thickness of each layer, and the thickness of each layer can be set as required, as long as the overall thickness meets the requirement.

In the embodiment, the emitter layer 2 may be arranged on a front surface of the crystalline silicon substrate 1, or on a back surface of the crystalline silicon substrate 1, and correspondingly, the tunneling passivation layer 6 and the doped silicon layer 7 may be arranged on the back surface of the crystalline silicon substrate 1, or on the front surface of the crystalline silicon substrate 1.

In the embodiment, the doped silicon layer 7 may only cover a partial region of the tunneling passivation layer 6, and meanwhile, the second covering layer 42 is also arranged at a region of the tunneling passivation layer 6 where the doped silicon layer 7 is not arranged. A pattern of the doped silicon layer 7 may correspond to a pattern of the second electrode 52. The doped silicon layer 7 is arranged only at the partial region of the tunneling passivation layer 6, thereby reducing absorption of the doped silicon layer 7 for light, facilitating the improvement of the photovoltaic conversion efficiency of the crystalline silicon solar cell and being particularly applicable to a case in which the tunneling passivation layer 6 and the doped silicon layer 7 are arranged on the front surface of the crystalline silicon substrate 1.

A preparation method for a crystalline silicon solar cell according to the embodiment, mainly includes steps of cleaning and texturing a front surface of a crystalline silicon substrate 1, forming an emitter layer 2, flattening a back surface of the crystalline silicon substrate 1, forming a tunneling passivation layer 6, forming a doped silicon layer 7 forming a gallium oxide layer X, forming a first covering layer 41 and a second covering layer 42, forming a first electrode 51 and a second electrode 52 and the like.

The specific implementation modes of the steps of cleaning and texturing the front surface of the crystalline silicon substrate 1, forming the emitter layer 2, flattening the back surface of the crystalline silicon substrate 1, forming the first covering layer 41 and the second covering layer 42, forming the gallium oxide layer X, forming the first electrode 51 and the second electrode 52 and the like can refer to the description in the first optional embodiment, and are not repeated herein.

For the step of forming the tunneling passivation layer 6, a preparation method can be selected according to a specific composition of the tunneling passivation layer 6, for example, in the case of using a silicon oxide layer as the tunneling passivation layer 6, a thermal oxidation process, a low-temperature furnace tube oxidation process, a nitric acid oxidation process, an ultraviolet/ozone oxidation process, a hydrogen peroxide oxidation process, an ALD process, or a CVD process and the like can be used.

For the step of forming the doped silicon layer 7 an intrinsic silicon layer (i.e., an undoped silicon layer, which may be a polycrystalline silicon layer, or an amorphous silicon layer) is formed on the tunneling passivation layer 6 firstly, and then the intrinsic silicon layer is doped to form the doped silicon layer 7. A doping method for the intrinsic silicon layer may be achieved by doping the intrinsic silicon layer by methods of diffusing, depositing a doped layer containing a doping source (e.g., depositing phosphorosilicate glass PSG) and annealing, or of ion implantation and annealing and the like; the doped silicon layer 7 can also be obtained by introducing a doping source during the growth of the intrinsic silicon layer, i.e., the doped silicon layer 7 is formed in an environment in which the doping source exists.

For the doped silicon layer 7 covering the partial region of the tunneling passivation layer 6, firstly, the doped silicon layer 7 covering the whole tunneling passivation layer 6 is formed on the tunneling passivation layer 6, then a protective layer is formed at a preset position of the doped silicon layer 7 and subsequently a portion, which is not covered by the protective layer, of the doped silicon layer 7 is removed, so as to form the doped silicon layer 7 at the partial region of the tunneling passivation layer 6. It should be understood that the preset position of the doped silicon layer 7 is a position corresponding to the partial region on the tunneling passivation layer 6, where the doped silicon layer 7 needs to be arranged.

The preset position of the doped silicon layer 7 can be irradiated by laser, a silicon oxide layer is formed at the preset position of the doped silicon layer 7 and the silicon oxide layer is used as the protective layer. The portion, which is not covered by the protective layer, of the doped silicon layer 7 can be removed by an alkali solution, e.g., a sodium hydroxide solution.

According to different ingredients of the protective layer, if the protective layer has a small influence on the performance of the crystalline silicon solar cell, for example, in the above-mentioned case in which the silicon oxide layer is used as the protective layer, the protective layer may or may not be removed; and if the protective layer has great influence on the performance of the crystalline silicon solar cell, the protective layer needs to be removed finally.

Third Optional Embodiment

FIG. 4 shows a structure of a crystalline silicon solar cell including a P-type crystalline silicon substrate, FIG. 5 shows a structure of another crystalline silicon solar cell including a P-type crystalline silicon substrate, and as shown in FIG. 4 and FIG. 5, the crystalline silicon solar cell according to the embodiment includes:

a crystalline silicon substrate 1 having a P-type conductivity, a gallium oxide layer X arranged on a surface of one side of the crystalline silicon substrate 1 and in direct contact with the crystalline silicon substrate 1, a third covering layer 43 arranged on the gallium oxide layer X, a third electrode 53 arranged on the third covering layer 43 and in contact with the crystalline silicon substrate 1, an emitter layer 2 arranged on a surface of one side, opposite to the gallium oxide layer X, of the crystalline silicon substrate 1, and having an N-type conductivity, a fourth covering layer 44 arranged on the emitter layer 2, and a fourth electrode 54 arranged on the fourth covering layer 44 and in contact with the emitter layer 2.

For the crystalline silicon substrate 1 having the P-type conductivity, a surface thereof is a P-type surface, and thus, in the crystalline silicon solar cell according to the embodiment, the gallium oxide layer X is directly arranged on the surface of the P-type crystalline silicon substrate 1.

In the embodiment, P-type crystalline silicon may be monocrystalline silicon, or polycrystalline silicon, and resistivity of the P-type crystalline silicon may be 0.1-10 Ω·cm (e.g., 0.1 Ω·cm, 0.2 Ω·cm, 0.3 Ω·cm, 0.4 Ω·cm, 0.5 Ω·cm, 0.6 Ω·cm, 0.7 Ω·cm, 0.8 Ω·cm, 0.9 Ω·cm, 1 Ω·cm, 2 Ω·cm, 3 Ω·cm, 4 Ω·cm, 5 Ω·cm, 6 Ω·cm, 7 Ω·cm, 8 Ω·cm, 9 Ω·cm, 10 Ω·cm and the like).

The emitter layer 2 may be located on a front surface of the crystalline silicon substrate 1, or on a back surface of the crystalline silicon substrate 1, and correspondingly, the gallium oxide layer X may be located on the back surface of the crystalline silicon substrate 1, or on the front surface of the crystalline silicon substrate 1.

The emitter layer 2 can be obtained by doping the P-type crystalline silicon substrate 1 with an N-type doping element (generally a group V element, including, but not limited to, phosphorus), and a sheet resistance value of the emitter layer 2 may be 40-200Ω/□ (e.g., 40 Ω/□, 50 Ω/□, 60 Ω/□, 70 Ω/□, 80 Ω/□, 90 Ω/□, 100 Ω/□, 110 Ω/□, 120 Ω/□, 130 Ω/□, 140 Ω/□, 150 Ω/□, 160 Ω/□, 170 Ω/□, 180 Ω/□, 190 Ω/□, 200Ω/□ and the like).

Further, in the embodiment, a thickness of the gallium oxide layer X may be 1-1,000 nm, e.g., 1 nanometer, 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1,000 nm and the like. Preferably, the thickness of the gallium oxide layer X may be 2-150 nm, and more preferably, the thickness of the gallium oxide layer X may be 5-60 nm.

The third covering layer 43 may include at least one of a silicon nitride layer, a silicon oxynitride layer, a silicon oxide layer and a silicon carbide layer, i.e., may be a single silicon nitride layer, a single silicon oxynitride layer or a single silicon oxide layer, or may be a lamination of two or more of the silicon nitride layer, the silicon oxynitride layer, the silicon oxide layer and the silicon carbide layer. An overall thickness of the third covering layer 43 may be 200 nm or less, e.g., 200 nm, 190 nm, 180 nm, 170 nm, 160 nm, 150 nm, 140 nm, 130 nm, 120 nm, 110 nm, 100 nm, 90 nm, 80 nm, 70 nm, 60 nm, 50 nm, 40 nm, 30 nm, 20 nm, 10 nm, 9 nm, 8 nm, 7 nm, 6 nm, 5 nm, 4 nm, 3 nm, 2 nm, 1 nm, 0.5 nm and the like. When the third covering layer 43 has a lamination structure, there is no strict requirement on a thickness of each layer, and the thickness of each layer can be set as required, as long as the overall thickness of the third covering layer 43 meets the requirement. The above-mentioned third covering layer 43 can further passivate (hydrogen diffusion) the crystalline silicon substrate 1. It should be noted that in the embodiment, the third covering layer 43 may also be not arranged, and the third electrode 53 is directly arranged on the gallium oxide layer X.

The fourth covering layer 44 may include at least one of a silicon nitride layer, a silicon oxynitride layer, a silicon oxide layer and a silicon carbide layer, i.e., may be a single silicon nitride layer, a single silicon oxynitride layer, a single silicon oxide layer or a single silicon carbide layer, or may be a lamination of two or more of the silicon nitride layer, the silicon oxynitride layer, the silicon oxide layer and the silicon carbide layer. A thickness of the fourth covering layer 44 may be 60-120 nm (e.g., 60 nm, 65 nm, 70 nm, 75 nm, 80 nm, 85 nm, 90 nm, 95 nm, 100 nm, 105 nm, 110 nm, 115 nm, 120 nm and the like). When the fourth covering layer 44 has a lamination structure, there is no strict requirement on a thickness of each layer, and the thickness of each layer can be set as required, as long as the overall thickness of the fourth covering layer 44 meets the requirement.

The third electrode 53 and the fourth electrode 54 may be metal electrodes (e.g., silver electrodes), and correspondingly, the contact between the third electrode 53 and the crystalline silicon substrate 1 is an ohmic contact, and the contact between the fourth electrode 54 and the emitter layer 2 is an ohmic contact.

In the embodiment, the fourth electrode 54 can be an electrode with a gate line structure (including a main gate line and a sub-gate line). In addition, a sheet resistance value of a region, corresponding to the fourth electrode 54, of the emitter layer 2 may be greater than the sheet resistance value of other regions (i.e., selective emitter), thereby improving the photovoltaic conversion efficiency of the crystalline silicon solar cell.

As shown in FIG. 4 and FIG. 5, the crystalline silicon solar cell according to the embodiment can be based on a Passivated Emitter and Rear Cell (PERC) structure. Specifically, the gallium oxide layer X and the third covering layer 43 are correspondingly provided with via holes O, and a surface field layer having a P-type conductivity is formed on a surface of the crystalline silicon substrate 1 in a region corresponding to the via holes O.

The P-type surface field layer may be formed in the following manner:

the third electrode 53 includes a first part 531 and a second part 532, the first part 531 is linear, the second part 532 is disposed on the third covering layer 43 in a region outside the first part 531, and the second part 532 is in contact with the first part 531.

The second part 532 is in contact with the crystalline silicon substrate 1 through the via holes O, and the surface field layer is formed on the surface of the crystalline silicon substrate 1 in the region corresponding to the via holes O.

Specifically, the first part 531 may also be referred to as the main electrode which is used for conduction convergence and the string welding of solar cells during the preparation of a photovoltaic module, the first part 531 can be provided with multiple, for example, 2 to 4, the multiple first parts 531 may be parallel to each other, and the first part 531 may be set as non-continuous linear electrodes. The first part 531 may be formed of silver paste, or may be formed of silver aluminum paste.

The second part 532 may be formed of aluminum paste. After the via holes O are formed on the gallium oxide layer X and the third covering layer 43, the aluminum paste for forming the second part 532 is printed on the third covering layer 43, and the aluminum paste is subjected to a diffusion reaction with the surface of the P-type crystalline silicon substrate 1 exposed at the via holes O, during the high-temperature sintering process so as to form an aluminum-doped P+ silicon layer and silicon aluminum alloy, wherein the P+ silicon layer (i.e., the P-type surface field layer) can make an energy band to bend and repel the distribution of minority carriers on the surface, thereby prolonging service lives of the minority carriers and have an effect of field passivation. The aluminum paste which is not subjected to diffusion reaction plays a role of conduction and forms the second part 532 of the third electrode 53.

Further, as shown in FIG. 6, the second part 532 can cover the whole third covering layer 43, or as shown in FIG. 7, the second part 532 covers part of the third covering layer 43. In a case that the second part 532 covers part of the third covering layer 43, the second part 532 may cover one whole via hole O, or may also cover only the part of one via hole O. It should be understood that the crystalline silicon solar cell, in which the second part 532 covers part of the third covering layer 43, can transmit light on both surfaces, can generate power on both surfaces, and has higher photovoltaic conversion efficiency.

The crosssectional shape of the via hole O may be a circle, a line (i.e., a long strip), a square, a triangle, a polygon with 5 or more sides or other shapes.

For a circular via hole O, the diameter may be 10-200 microns (e.g., 10 microns, 20 microns, 30 microns, 40 microns, 50 microns, 60 microns, 70 microns, 80 microns, 90 microns, 100 microns, 110 microns, 120 microns, 130 microns, 140 microns, 150 microns, 160 microns, 170 microns, 180 microns, 190 microns, 200 microns and the like), and the hole spacing may be 100-1,000 microns (e.g., 100 microns, 200 microns, 300 microns, 400 microns, 500 microns, 600 microns, 700 microns, 800 microns, 900 microns, 1,000 microns and the like).

For a linear via hole O, the width may be 20-100 microns (e.g., 20 microns, 30 microns, 40 microns, 50 microns, 60 microns, 70 microns, 80 microns, 90 microns, 100 microns and the like), and the length may be slightly smaller than the side length of the crystalline silicon substrate 1 (the crystalline silicon substrate 1 generally is a square or a square with a chamfer). The length direction of the linear via hole O may be perpendicular to the length direction of the first part 531 of the third electrode 53. There can be multiple linear via holes O, and the multiple linear via holes O are parallel to each other, and a distance between the two adjacent linear via holes O may be 500-2,000 microns (e.g., 500 microns, 600 microns, 700 microns, 800 microns, 900 microns, 1,000 microns, 1,100 microns, 1,200 microns, 1,300 microns, 1,400 microns, 1,500 microns, 1,600 microns, 1,700 microns, 1,800 microns, 1,900 microns and 2,000 microns). In the embodiment of the present disclosure, the linear via hole O may be set in the form of a dashed line, i.e., the linear via hole O is discontinuous in the length direction.

A preparation method for a crystalline silicon solar cell according to the embodiment, mainly includes steps of cleaning and texturing a front surface of a crystalline silicon substrate 1, forming an emitter layer 2, flattening a back surface of the crystalline silicon substrate 1, forming a gallium oxide layer X, forming a third covering layer 43 and a fourth covering layer 44, forming a third electrode 53 and a fourth electrode 54 and the like.

By cleaning and texturing the front surface of the crystalline silicon substrate 1, reflectivity can be reduced. The crystalline silicon substrate 1 can be cleaned by a mixed aqueous solution of sodium hydroxide (NaOH) and hydrogen peroxide (H2O2) so as to remove surface pollutants and a damaged layer. Texturing can be carried out by an alkali corrosion solution or an acid corrosion solution, and the alkali corrosion solution may be an aqueous solution of sodium hydroxide.

For a P-type crystalline silicon substrate 1, reflectivity of a surface of a monocrystalline silicon wafer may be 10%-18% (e.g., 10%, 11%, 12%, 13%, 14%, 15%, 16%, 17%, 18% and the like), reflectivity of a surface of a polycrystalline silicon wafer may be 6% to 20% (e.g., 6%, 7%, 8%, 9%, 10%, 11%, 12%, 13%, 14%, 15%, 16%, 17%, 18%, 19%, 20% and the like).

The emitter layer 2 may be formed by methods of diffusing (e.g., furnace tube phosphorus diffusion), depositing a doped layer containing a doping source (e.g., phosphorsilicate glass PSG) and annealing, or of ion implanting (e.g., implanting phosphorus ions) and annealing and the like.

The back surface of the crystalline silicon substrate 1 can be flattened by a chemical solution so as to appropriately reduce a specific surface area of the back surface of the crystalline silicon substrate 1, and the silicon wafer is cleaned with hydrofluoric acid, wherein the chemical solution may be an alkali solution including, but not limited to, a tetramethyl ammonium hydroxide solution, a sodium hydroxide solution, a potassium hydroxide solution and the like, and concentration of the alkali solution can be adjusted as required; and the chemical solution may also be an acid solution, e.g., a mixed solution of nitric acid, hydrogen fluoride and sulfuric acid, and the concentration of each acid solution and the ratio of each acid solution in the mixed solution can also be adjusted as required.

The gallium oxide layer X may be formed by ALD, PECVD, APCVD or LPCVD. After the gallium oxide layer X is deposited, the annealing step also needs to be carried out.

The third covering layer 43 and the fourth covering layer 44 may also be formed by methods of ALD, PECVD, APCVD, LPCVD and the like. When the third covering layer 43 and the fourth covering layer 44 have the same composition, they can be simultaneously formed.

The third electrode 53 and the fourth electrode 54 may be formed by screen printing electrode paste and rapidly high-temperature sintering. A sintering temperature may be 600-900° C. (e.g., 600° C., 650° C., 700° C., 750° C., 800° C., 850° C., 900° C. and the like), and sintering time may be 10 seconds to 3 minutes, e.g., 10 seconds, 20 seconds, 30 seconds, 40 seconds, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds and the like.

For the PERC battery, after the third covering layer 43 is formed, the step of forming the via holes O in the gallium oxide layer X and the third covering layer 43 also needs to be carried out, and the via holes O may be formed by methods of laser or chemical corrosion. The printing process of the third electrode 53 specifically includes: firstly, printing paste for forming the first part 531, and then printing paste for forming the second part 532.

Fourth Optional Embodiment

Figure 8:
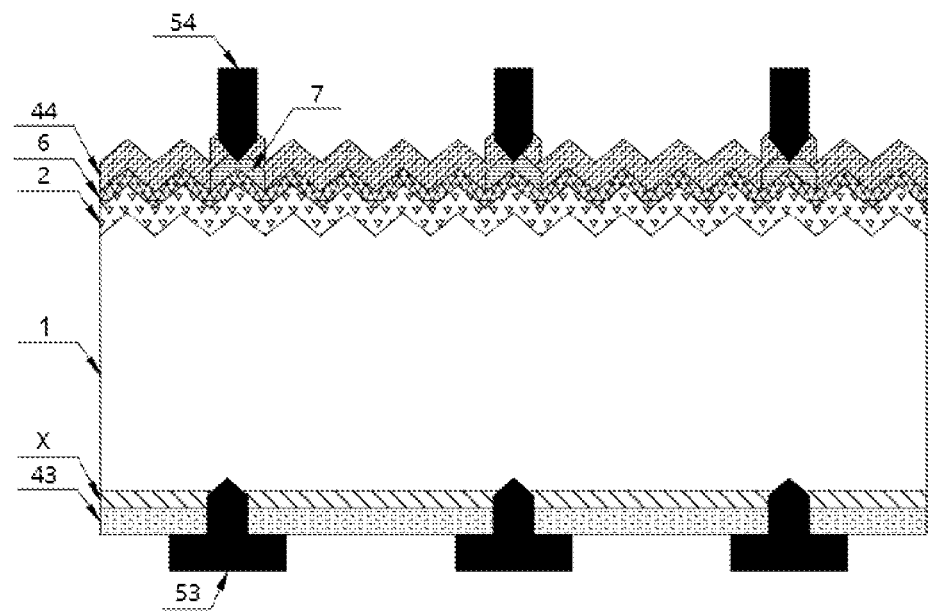
FIG. 8 is a structural schematic diagram of another crystalline silicon solar cell including a crystalline silicon substrate having a P-type conductivity according to an embodiment of the present disclosure.

FIG. 8 shows a structure of yet another crystalline silicon solar cell including a P-type crystalline silicon substrate, and as shown in FIG. 8, the crystalline silicon solar cell includes:

a crystalline silicon substrate 1 having a P-type conductivity, a gallium oxide layer X arranged on a surface of one side of the crystalline silicon substrate 1 and in direct contact with the crystalline silicon substrate 1, a third covering layer 43 arranged on the gallium oxide layer X, a third electrode 53 arranged on the third covering layer 43 and in contact with the crystalline silicon substrate 1, an emitter layer 2 arranged on the surface of one side, opposite to the gallium oxide layer X, of the crystalline silicon substrate 1, and having an N-type conductivity, a tunneling passivation layer 6 arranged on the emitter layer 2, a doped silicon layer 7 arranged on the tunneling passivation layer 6 and having an N-type conductivity, a fourth covering layer 44 arranged on the doped silicon layer 7, and a fourth electrode 54 arranged on the fourth covering layer 44 and in contact with the doped silicon layer 7.

Similar to the above-mentioned third optional embodiment, in the crystalline silicon solar cell according to the embodiment, the gallium oxide layer X is also directly disposed on the surface of the P-type crystalline silicon substrate 1. In addition, the crystalline silicon solar cell according to the embodiment adopts a TOP-Con structure on one side of the emitter layer 2.

In the embodiment, resistivity of the crystalline silicon substrate 1, a sheet resistance value of the emitter layer 2, a composition and a thickness of the third covering layer 43, a specific form of the fourth electrode 54 and the like can refer to description in the above-mentioned third optional embodiment, and are not repeated herein.

In the embodiment, a thickness of the gallium oxide layer X preferably is 10 nm to 90 nm, and more preferably, is 20 nm to 60 nm.

In the embodiment, the doped silicon layer 7 may be a doped polycrystalline silicon layer, a doped amorphous silicon layer, or a doped polycrystalline silicon/silicon oxide mixed layer, wherein the polycrystalline silicon/silicon oxide mixed layer is formed in a manner that polycrystalline silicon particles are uniformly distributed in a silicon oxide thin film or surfaces of the polycrystalline silicon particles are coated with the silicon oxide thin film. A thickness of the doped silicon layer 7 may be 20-1,000 nm, e.g., 20 nm, 50 nm, 100 nm, 150 nm, 200 nm, 250 nm, 300 nm, 350 nm, 400 nm, 450 nm, 500 nm, 550 nm, 600 nm, 750 nm, 800 nm, 850 nm, 900 nm, 950 nm, 1,000 nm and the like.

An element doped in the doped silicon layer 7 may be a group V element (including, but not limited to, phosphorus), and doping concentration of the doped element may be $5 \times 10^{18}$-$9 \times 10^{20}$ atoms/cm$^3$, e.g., $5 \times 10^{18}$ atoms/cm$^3$, $6 \times 10^{18}$ atoms/cm$^3$, $7 \times 10^{18}$ atoms/cm$^3$, $8 \times 10^{18}$ atoms/cm$^3$, $9 \times 10^{18}$ atoms/cm$^3$, $1 \times 10^{19}$ atoms/cm$^3$, $2 \times 10^{19}$ atoms/cm$^3$, $3 \times 10^{19}$ atoms/cm$^3$, $4 \times 10^{19}$ atoms/cm$^3$, $5 \times 10^{19}$ atoms/cm$^3$, $6 \times 10^{19}$ atoms/cm$^3$, $7 \times 10^{19}$ atoms/cm$^3$, $8 \times 10^{19}$ atoms/cm$^3$, $9 \times 10^{19}$ atoms/cm$^3$, $1 \times 10^{20}$ atoms/cm$^3$, $2 \times 10^{20}$ atoms/cm$^3$, $3 \times 10^{20}$ atoms/cm$^3$, $4 \times 10^{20}$ atoms/cm$^3$, $5 \times 10^{20}$ atoms/cm$^3$, $6 \times 10^{20}$ atoms/cm$^3$, $7 \times 10^{20}$ atoms/cm$^3$, $8 \times 10^{20}$ atoms/cm$^3$, $9 \times 10^{20}$ atoms/cm$^3$ and the like.

Correspondingly, the tunneling passivation layer 6 arranged on the emitter layer 2 may be an electronic tunneling passivation layer, and has a certain blocking effect on diffusion of the group V element at a high temperature, i.e., at the high temperature, a diffusion rate of the group V element in the tunneling passivation layer is much smaller than a diffusion rate of the group V element in the doped silicon layer 7. The tunneling passivation layer 6 may be at least one of a silicon oxide layer, a silicon oxynitride layer and a hydrogenated amorphous silicon oxide layer. A thickness of the front tunneling passivation layer 6 may be 1.2-2.5 nm, e.g., 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm, 2.5 nm and the like.

The fourth covering layer 44 may include at least one of a silicon nitride layer, a silicon oxynitride layer, a silicon oxide layer and a silicon carbide layer, i.e., may be a single silicon nitride layer, a single silicon oxynitride layer, a single silicon oxide layer or a single silicon carbide layer, or may be a lamination of two or more of the silicon nitride layer, the silicon oxynitride layer, the silicon oxide layer and the silicon carbide layer. A thickness of the fourth covering layer 44 may be 68-100 nm (e.g., 68 nm, 70 nm, 72 nm, 74 nm, 75 nm, 76 nm, 78 nm, 80 nm, 82 nm, 84 nm, 85 nm, 86 nm, 88 nm, 90 nm, 92 nm, 94 nm, 95 nm, 96 nm, 98 nm, 100 nm and the like). When the fourth covering layer 44 is a lamination structure, there is no strict requirement on a thickness of each layer, and the thickness of each layer can be set as required, as long as the overall thickness of the fourth covering layer 44 meets the requirement.

In the embodiment, the doped silicon layer 7 may only cover a partial region of the tunneling passivation layer 6, and meanwhile, the fourth covering layer 44 is also arranged at a region of the tunneling passivation layer 6 where the doped silicon layer 7 is not arranged. A pattern of the doped silicon layer 7 may correspond to a pattern of the fourth electrode 54. Only disposing the doped silicon layer 7 on the partial region of the tunneling passivation layer 6 can reduce absorption of the doped silicon layer 7 for light, facilitating promotion of the photovoltaic conversion efficiency of the crystalline silicon solar cell and being particularly applicable to a case in which the tunneling passivation layer 6 and the doped silicon layer 7 are arranged on a front surface of the crystalline silicon substrate 1.

In the embodiment, the gallium oxide layer X, the third covering layer 43 and the third electrode 53 may also be set to be PERC structures, and the specific structures can refer to description of the above third optional embodiment and are not repeated herein.

A preparation method of a crystalline silicon solar cell according to the embodiment, mainly includes steps of cleaning and texturing a front surface of a crystalline silicon substrate 1; forming an emitter layer 2; flattening a back surface of the crystalline silicon substrate 1; forming a tunneling passivation layer 6; forming a doped silicon layer 7; forming a gallium oxide layer X; forming a third covering layer 43 and a fourth covering layer 44; forming a third electrode 53 and a fourth electrode 54; and the like.

Specific implementation modes of the steps of cleaning and texturing the front surface of the crystalline silicon substrate 1, forming the emitter layer 2, flattening the back surface of the crystalline silicon substrate 1, forming the gallium oxide layer X, forming the third covering layer 43 and the fourth covering layer 44, forming the third electrode 53 and the fourth electrode 54 and the like can refer to description in the above-mentioned third optional embodiment, and are not repeated herein.

In the embodiment, the steps of forming the tunneling passivation layer 6 and the doped silicon layer 7 can refer to description in the above-mentioned second optional embodiment; and preparation of the doped silicon layer 7 covering the partial region of the tunneling passivation layer 6 identically can refer to description in the above-mentioned second optional embodiment, and is not repeated herein.

Fifth Optional Embodiment

Figure 9:
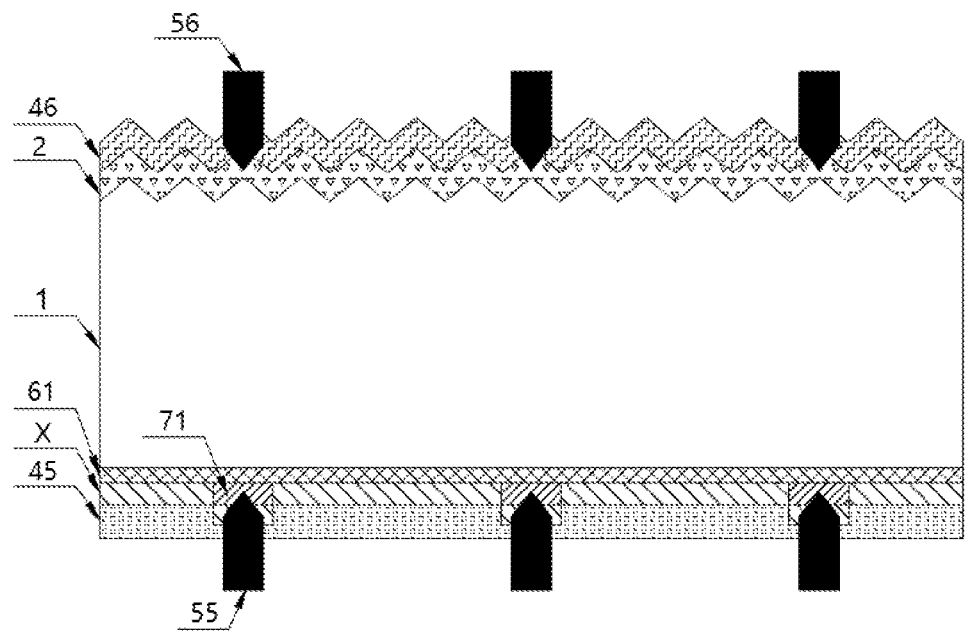
FIG. 9 is a structural schematic diagram of a further crystalline silicon solar cell including a crystalline silicon substrate having a P-type conductivity according to an embodiment of the present disclosure.

FIG. 9 shows a structure of still a further crystalline silicon solar cell including a P-type crystalline silicon substrate 1, and as shown in FIG. 9, the crystalline silicon solar cell includes:

a crystalline silicon substrate 1 having a P-type conductivity, a first tunneling passivation layer 61 arranged on a surface of one side of the crystalline silicon substrate 1, a first doped silicon layer 71 arranged on the first tunneling passivation layer 61 and having a P-type conductivity, a gallium oxide layer X arranged on the first doped silicon layer 71, a fifth covering layer 45 arranged on the gallium oxide layer X, a fifth electrode 55 arranged on the fifth covering layer 45 and in contact with the first doped silicon layer 71, an emitter layer 2 arranged on a surface of one side, opposite to the first tunneling passivation layer 61, of the crystalline silicon substrate 1, and having an N-type conductivity, a sixth covering layer 46 arranged on the emitter layer 2, and a sixth electrode 56 arranged on the sixth covering layer 46 and in contact with the emitter layer 2.

In the crystalline silicon solar cell according to the embodiment, a TOP-Con structure is adopted on one side, opposite to the emitter layer 2, of the P-type crystalline silicon substrate 1, and the gallium oxide layer X is arranged on the P-type first doped silicon layer 71, i.e., in the embodiment, the gallium oxide layer X is in direct contact with the P-type first doped silicon layer 71.

In the embodiment, the P-type crystalline silicon substrate 1 may be monocrystalline silicon, or polycrystalline silicon, and resistivity may be 0.1-10 Ω·cm (e.g., 0.1 Ω·cm, 0.2 Ω·cm, 0.3 Ω·cm, 0.4 Ω·cm, 0.5 Ω·cm, 0.6 Ω·cm, 0.7 Ω·cm, 0.8 Ω·cm, 0.9 Ω·cm, 1 Ω·cm, 2 Ω·cm, 3 Ω·cm, 4 Ω·cm, 5 Ω·cm, 6 Ω·cm, 7 Ω·cm, 8 Ω·cm, 9 Ω·cm, 10 Ω·cm and the like).

The emitter layer 2 may be positioned on a front surface of the crystalline silicon substrate 1, or on a back surface of the crystalline silicon substrate 1, and correspondingly, the first tunneling passivation layer 61, the first doped silicon layer 71 and the gallium oxide layer X may be positioned on the back surface of the crystalline silicon substrate 1, or on the front surface of the crystalline silicon substrate 1.

The emitter layer 2 can be formed by doping the P-type crystalline silicon substrate 1 with a group V element (including, but not limited to, phosphorus), and a sheet resistance value of the emitter layer 2 may be 40-200Ω/□ (e.g., 40 Ω/□, 50 Ω/□, 60 Ω/□, 70 Ω/□, 80 Ω/□, 90 Ω/□, 100 Ω/□, 110 Ω/□, 120 Ω/□, 130 Ω/□, 140 Ω/□, 150 Ω/□, 160 Ω/□, 170 Ω/□, 180 Ω/□, 190 Ω/□, 200Ω/□ and the like).

Further, in the embodiment, a thickness of the gallium oxide layer X may be 10-90 nm, e.g., 1 nm, 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm and the like. Preferably, the thickness of the gallium oxide layer X may be 20-60 nm.

The first doped silicon layer 71 may be a doped polycrystalline silicon layer, a doped amorphous silicon layer, or a doped polycrystalline silicon/silicon oxide mixed layer, wherein the polycrystalline silicon/silicon oxide mixed layer is formed in a manner that polycrystalline silicon particles are uniformly distributed in a silicon oxide thin film or surfaces of the polycrystalline silicon particles are coated with the silicon oxide thin film.

An element doped in the first doped silicon layer 71 may be a group III element (including, but not limited to, boron), and doping concentration of the doped element may be $1\times10^{18}$-$8\times10^{20}$ atoms/cm$^3$, e.g., $1\times10^{18}$ atoms/cm$^3$, $2\times10^{18}$ atoms/cm$^3$, $3\times10^{18}$ atoms/cm$^3$, $4\times10^{18}$ atoms/cm$^3$, $5\times10^{18}$ atoms/cm$^3$, $6\times10^{18}$ atoms/cm$^3$, $7\times10^{18}$ atoms/cm$^3$, $8\times10^{18}$ atoms/cm$^3$, $9\times10^{18}$ atoms/cm$^3$, $1\times10^{19}$ atoms/cm$^3$, $2\times10^{19}$ atoms/cm$^3$, $3\times10^{19}$ atoms/cm$^3$, $4\times10^{19}$ atoms/cm$^3$, $5\times10^{19}$ atoms/cm$^3$, $6\times10^{19}$ atoms/cm$^3$, $7\times10^{19}$ atoms/cm$^3$, $8\times10^{19}$ atoms/cm$^3$, $9\times10^{19}$ atoms/cm$^3$, $1\times10^{20}$ atoms/cm$^3$, $2\times10^{20}$ atoms/cm$^3$, $3\times10^{20}$ atoms/cm$^3$, $4\times10^{20}$ atoms/cm$^3$, $5\times10^{20}$ atoms/cm$^3$, $6\times10^{20}$ atoms/cm$^3$, $7\times10^{20}$ atoms/cm$^3$, $8\times10^{20}$ atoms/cm$^3$ and the like. A thickness of the first doped silicon layer 71 may be 20-1,000 nm, e.g., 20 nm, 50 nm, 100 nm, 150 nm, 200 nm, 250 nm, 300 nm, 350 nm, 400 nm, 450 nm, 500 nm, 550 nm, 600 nm, 750 nm, 800 nm, 850 nm, 900 nm, 950 nm, 1,000 nm and the like.

Correspondingly, the first tunneling passivation layer 61 may be a hole tunneling passivation layer, and has a certain blocking effect on diffusion of the group III element at a high temperature, i.e., at the high temperature, a diffusion rate of the group III element in the first tunneling passivation layer 61 is much smaller than a diffusion rate of the group III element in the first doped silicon layer 71, the first tunneling passivation layer 61 may be at least one of a silicon oxide layer, an aluminum oxide layer, a vanadium oxide layer, a tungsten oxide layer, a nickel oxide layer, a molybdenum oxide layer and a cuprous chloride layer, and a thickness of the first tunneling passivation layer 61 may be 1.2-2.5 nm, e.g., 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm and 2.5 nm.

The fifth covering layer 45 arranged on the gallium oxide layer X may include at least one of a silicon nitride layer, a silicon oxynitride layer, a silicon oxide layer and a silicon carbide layer, i.e., may be a single silicon nitride layer, a single silicon oxynitride layer, a single silicon oxide layer or a single silicon carbide layer, or may be a lamination of two or more of the silicon nitride layer, the silicon oxynitride layer, the silicon oxide layer and the silicon carbide layer. An overall thickness of the fifth covering layer 45 may be 20-200 nm, e.g., 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm and the like. When the fifth covering layer 45 is a lamination structure, there is no strict requirement on a thickness of each layer, and the thickness of each layer can be set as required, as long as the overall thickness of the fifth covering layer 45 meets the requirement. It should be noted that in the embodiment of the present disclosure, the fifth covering layer 45 may also be not arranged, and the fifth electrode 55 is directly arranged on the gallium oxide layer X.

In the embodiment, the first doped silicon layer 71 may only cover a partial region of the first tunneling passivation layer 61, and meanwhile, the gallium oxide layer X is also arranged at a region of the first tunneling passivation layer 61 where the first doped silicon layer 71 is not arranged. A pattern of the first doped silicon layer 71 may correspond to a pattern of the fifth electrode 55.

The sixth covering layer 46 may include at least one of a silicon nitride layer, a silicon oxynitride layer, a silicon oxide layer and a silicon carbide layer, i.e., may be a single silicon nitride layer, a single silicon oxynitride layer, the single silicon oxide layer or a single silicon carbide layer, or may be a lamination of two or more of the silicon nitride layer, the silicon oxynitride layer, the silicon oxide layer and the silicon carbide layer. A thickness of the sixth covering layer 46 may be 68-100 nm (e.g., 68 nm, 70 nm, 72 nm, 74 nm, 75 nm, 76 nm, 78 nm, 80 nm, 82 nm, 84 nm, 85 nm, 86 nm, 88 nm, 90 nm, 92 nm, 94 nm, 95 nm, 96 nm, 98 nm, 100 nm and the like). When the sixth covering layer 46 is a lamination structure, there is no strict requirement on a thickness of each layer, and the thickness of each layer can be set as required, as long as the overall thickness of the sixth covering layer 46 meets the requirement.

Both the fifth electrode 55 and the sixth electrode 56 may be electrodes with gate line structures, including a main gate line and a sub-gate line. Correspondingly, the first doped silicon layer 71 is of a latticed structure. A width of the part, corresponding to the main gate line of the fifth electrode 55, of the latticed first doped silicon layer 71, is slightly greater than a width of the main gate line, and a width of the part, corresponding to the sub-gate line, of the latticed first doped silicon layer 71, is slightly greater than a width of the sub-gate line.

In addition, a sheet resistance value of the region, corresponding to the sixth electrode 56, of the emitter layer 2 may be greater than sheet resistance values of other regions (i.e., selective emitter), thereby improving the photovoltaic conversion efficiency of the crystalline silicon solar cell.

A preparation method of a crystalline silicon solar cell according to the embodiment, mainly includes steps of cleaning and texturing a front surface of a crystalline silicon substrate 1; forming an emitter layer 2; flattening a back surface of the crystalline silicon substrate 1; forming a first tunneling passivation layer 61; forming a first doped silicon layer 71; forming a gallium oxide layer X; forming a fifth covering layer 45 and a sixth covering layer 46; forming a fifth electrode 55 and a sixth electrode 56, and the like.

Specific implementation modes of the steps of cleaning and texturing the front surface of the crystalline silicon substrate 1, forming the emitter layer 2, flattening the back surface of the crystalline silicon substrate 1, forming the gallium oxide layer X, forming the fifth covering layer 45 and the sixth covering layer 46, forming the fifth electrode 55 and the sixth electrode 56 and the like can refer to description in the above-mentioned third optional embodiment, and are not repeated herein.

In the embodiment, the steps of forming the first tunneling passivation layer 61 and the first doped silicon layer 71 can refer to description in the above-mentioned second optional embodiment; and preparation of the first doped silicon layer 71 covering the partial region of the first tunneling passivation layer 61 identically can refer to description in the above-mentioned second optional embodiment, and is not repeated herein.

Sixth Optional Embodiment

Figure 10:
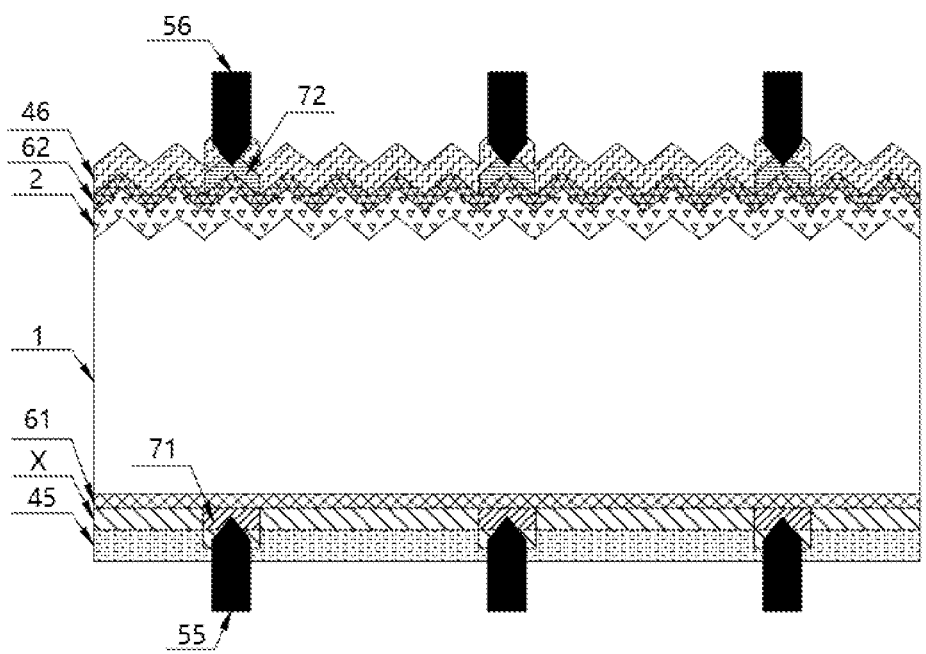
FIG. 10 is a structural schematic diagram of another crystalline silicon solar cell including a crystalline silicon substrate having a P-type conductivity according to an embodiment of the present disclosure.

FIG. 10 shows a structure of another crystalline silicon solar cell including a P-type crystalline silicon substrate 1, and as shown in FIG. 10, the crystalline silicon solar cell includes:

a crystalline silicon substrate 1 with a P-type conductivity, a first tunneling passivation layer 61 arranged on a surface of one side of the crystalline silicon substrate 1, a first doped silicon layer 71 arranged on the first tunneling passivation layer 61 and having a P-type conductivity, a gallium oxide layer X arranged on the first doped silicon layer 71, a fifth covering layer 45 arranged on the gallium oxide layer X, a fifth electrode 55 arranged on the fifth covering layer 45 and in contact with the first doped silicon layer 71, an emitter layer 2 arranged on a surface of one side, opposite to the first tunneling passivation layer 61, of the crystalline silicon substrate 1, and having an N-type conductivity, a second tunneling passivation layer 62 arranged on the emitter layer 2, a second doped silicon layer 72 arranged on the second tunneling passivation layer 62 and having an N-type conductivity, a sixth covering layer 46 arranged on the second doped silicon layer 72, and a sixth electrode 56 arranged on the sixth covering layer 46 and in contact with the second doped silicon layer 72.

In the crystalline silicon solar cell according to the embodiment, a TOP-Con structure is adopted on both sides of the P-type crystalline silicon substrate 1, and the gallium oxide layer X is arranged on the P-type first doped silicon layer 71, i.e., in the embodiment, the gallium oxide layer X is also in direct contact with the P-type first doped silicon layer 71.

In the embodiment, resistivity of the crystalline silicon substrate 1, a sheet resistance value of the emitter layer 2, a composition and a thickness of the fifth covering layer 45, a composition and a thickness of the sixth covering layer 46, specific forms of the first tunneling passivation layer 61, the first doped silicon layer 71, the fifth electrode 55 and the sixth electrode 56 and the like can refer to description in the above-mentioned third optional embodiment, and are not repeated herein.

The second doped silicon layer 72 may be a doped polycrystalline silicon layer, a doped amorphous silicon layer, or a doped polycrystalline silicon/silicon oxide mixed layer, wherein the polycrystalline silicon/silicon oxide mixed layer is formed in a manner that polycrystalline silicon particles are uniformly distributed in a silicon oxide thin film or surfaces of the polycrystalline silicon particles are coated with the silicon oxide thin film. A thickness of the second doped silicon layer 72 may be 20-1,000 nm, e.g., 20 nm, 50 nm, 100 nm, 150 nm, 200 nm, 250 nm, 300 nm, 350 nm, 400 nm, 450 nm, 500 nm, 550 nm, 600 nm, 750 nm, 800 nm, 850 nm, 900 nm, 950 nm, 1,000 nm and the like.

An element doped in the second doped silicon layer 72 may be a group V element (including, but not limited to, phosphorus), and doping concentration of the doped element may be $5\times10^{18}$-$9\times10^{20}$ atoms/cm$^3$, e.g., $5\times10^{18}$ atoms/cm$^3$, $6\times10^{18}$ atoms/cm$^3$, $7\times10^{18}$ atoms/cm$^3$, $8\times10^{18}$ atoms/cm$^3$, $9\times10^{18}$ atoms/cm$^3$, $1\times10^{19}$ atoms/cm$^3$, $2\times10^{19}$ atoms/cm$^3$, $3\times10^{19}$ atoms/cm$^3$, $4\times10^{19}$ atoms/cm$^3$, $5\times10^{19}$ atoms/cm$^3$, $6\times10^{19}$ atoms/cm$^3$, $7\times10^{19}$ atoms/cm$^3$, $8\times10^{19}$ atoms/cm$^3$, $9\times10^{19}$ atoms/cm$^3$, $1\times10^{20}$ atoms/cm$^3$, $2\times10^{20}$ atoms/cm$^3$, $3\times10^{20}$ atoms/cm$^3$, $4\times10^{20}$ atoms/cm$^3$, $5\times10^{20}$ atoms/cm$^3$, $6\times10^{20}$ atoms/cm$^3$, $7\times10^{20}$ atoms/cm$^3$, $8\times10^{20}$ atoms/cm$^3$, $9\times10^{20}$ atoms/cm$^3$ and the like.

Correspondingly, the second tunneling passivation layer 62 may be an electronic tunneling passivation layer, and has a certain blocking effect on diffusion of the group V element at a high temperature, i.e., at the high temperature, a diffusion rate of the group V element in a front tunneling passivation layer is much smaller than a diffusion rate of the group V element in the second doped silicon layer 72. The second tunneling passivation layer 62 may be at least one of a silicon oxide layer, a silicon oxynitride layer and a hydrogenated amorphous silicon oxide layer. A thickness of the second tunneling passivation layer 62 may be 1.2-2.5 nm, e.g., 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm and 2.5 nm.

In the embodiment, the second doped silicon layer 72 may also only cover a partial region of the second tunneling passivation layer 62, and meanwhile, the sixth covering layer 46 is arranged at a region of the second tunneling passivation layer 62 where the second doped silicon layer 72 is not arranged. A pattern of the second doped silicon layer 72 may correspond to a pattern of the sixth electrode 56. In a case that the sixth electrode 56 is an electrode with a gate line structure, the second doped silicon layer 72 may be of a latticed structure. A width of the part, corresponding to a main gate line of the sixth electrode 56, of the second doped silicon layer 72, is slightly greater than a width of the main gate line, and a width of the part corresponding to the sub-gate line, of the second doped silicon layer 72, is slightly greater than a width of the sub-gate line.

A preparation method of a crystalline silicon solar cell according to the embodiment, mainly includes steps of cleaning and texturing a front surface of a crystalline silicon substrate 1; forming an emitter layer 2; flattening a back surface of the crystalline silicon substrate 1; forming a first tunneling passivation layer 61; forming a second tunneling passivation layer 62; forming a first doped silicon layer 71; forming a second doped silicon layer 72; forming a gallium oxide layer X; forming a fifth covering layer 45 and a sixth covering layer 46; and forming a fifth electrode 55 and a sixth electrode 56, and the like.

Specific implementation modes of the steps of cleaning and texturing the front surface of the crystalline silicon substrate 1, forming the emitter layer 2, flattening the back surface of the crystalline silicon substrate 1, forming the gallium oxide layer X, forming the fifth covering layer 45 and the sixth covering layer 46, and forming the fifth electrode 55 and the sixth electrode 56 and the like can refer to description in the above-mentioned third optional embodiment, and are not repeated herein.

In the embodiment, the steps of forming the first tunneling passivation layer 61, the second tunneling passivation layer 62, the first doped silicon layer 71 and the second doped silicon layer 72 can refer to description in the above-mentioned second optional embodiment; and preparation of the first doped silicon layer 71 covering a partial region of the first tunneling passivation layer 61 and the second doped silicon layer 72 covering a partial region of the second tunneling passivation layer 62 identically can refer to description in the above-mentioned second optional embodiment, and is not repeated herein.

Based on the above-mentioned crystalline silicon solar cell, an embodiment of the present disclosure provides a photovoltaic module. The photovoltaic module includes a cover plate, a first encapsulant film, a cell string, a second encapsulant film and a backplane disposed in sequence, and the cell string includes a plurality of solar cells, wherein the solar cell is the above-mentioned crystalline silicon solar cell according to the embodiments of the present disclosure.

The gallium oxide layer X in direct contact with the P-type silicon layer is arranged in the crystalline silicon solar cell according to the embodiments of the present disclosure, negative charges of the gallium oxide layer X are used to carry out chemical passivation and field passivation on a surface of the P-type silicon layer, and the photovoltaic conversion efficiency of the solar cell is improved, so that the photovoltaic module applying the crystalline silicon solar cell has higher output power, thereby reducing cost per kilowatt hour of electricity and improving cost performance of photovoltaic power generation.

In the embodiment of the present disclosure, the cover plate generally is a glass plate, materials of the first encapsulant film and the second encapsulant film are Ethylene-Vinyl Acetate (EVA) copolymers, and the backplane may be a glass plate, or a TPT (PVF/PET/PVF) plate, wherein when the backplane adopts the TPT plate, the photovoltaic module further includes a frame, and the frame is filled with silica gel.

In the photovoltaic module according to the embodiment of the present disclosure, the crystalline silicon solar cell may be a square whole cell piece or a square whole cell piece with a filleted corner, or a sliced cell piece obtained by cutting the whole cell piece.

The photovoltaic module according to the embodiment of the present disclosure may include a plurality of cell strings, and cell pieces in each cell string may be connected by welding strips, or by a conductive glue or other conductive materials. In each cell string, a certain gap may be reserved between adjacent cell pieces, or edges of adjacent cell pieces may be overlapped, i.e., imbrication-type connection is adopted.

An embodiment of the present disclosure further provides use of gallium oxide as a passivation substance or a passivation structure in a crystalline silicon solar cell, and specifically, the gallium oxide is in direct contact with a P-type silicon layer of the crystalline silicon solar cell.

As is mentioned above, the P-type silicon layer in the embodiment of the present disclosure specifically may be:

(1) a surface of a P-type crystalline silicon substrate;

(2) a P-type doped silicon layer arranged on one side of the P-type crystalline silicon substrate, wherein a tunneling passivation layer with a certain blocking effect on diffusion of a group III element at a high temperature may also be arranged between the doped silicon layer and the crystalline silicon substrate;

(3) a P-type surface field layer arranged on one side of the P-type crystalline silicon substrate;

(4) an emitter layer arranged on one side of an N-type crystalline silicon substrate; and (5) a P-type doped silicon layer arranged on the emitter layer of the N-type crystalline silicon substrate, wherein the tunneling passivation layer with a certain blocking effect on diffusion of the group III element may also be arranged between the doped silicon layer and the emitter layer of the crystalline silicon substrate.

The technical solutions of the present disclosure will be further illustrated below by specific examples.

In order to facilitate description, in the following examples, the electrode, the covering layer, the tunneling passivation layer and the doped silicon layer disposed on the front surface of the crystalline silicon solar cell are respectively referred to as a front electrode, a front covering layer, a front tunneling passivation layer and a front doped silicon layer; and the electrode, the covering layer, the tunneling passivation layer and the doped silicon layer disposed on the back surface of the crystalline silicon solar cell are respectively referred to as a back electrode, a back covering layer, a back tunneling passivation layer and a back doped silicon layer.

EXAMPLE 1

The example provides an N-type crystalline silicon double-sided solar cell passivated by gallium oxide, and as shown in FIG. 2, the solar cell includes a front electrode, a front covering layer, a gallium oxide layer, an emitter layer, an N-type crystalline silicon substrate, an N-type surface field layer, a back covering layer and a back electrode disposed in sequence from front to back.

The N-type crystalline silicon substrate is an N-type monocrystalline silicon wafer with resistivity of 2.0 Ω·cm and a size of 156.75 mm×156.75 mm The emitter layer is formed by furnace tube boron diffusion, and after doping, its sheet resistance value is 80 Ω/□.

A thickness of the gallium oxide layer is 20 nm.

The front covering layer is a silicon nitride layer, and has a thickness of 65 nm.

The N-type surface field layer positioned on a back surface of the N-type crystalline silicon substrate is formed by a phosphorus ion implantation method, and after doping, its sheet resistance value is 110 Ω/□.

The back covering layer positioned on the N-type surface field layer is a silicon nitride layer, and has a thickness of 75 nm.

Both the front electrode and the back electrode are of gate line structures, wherein there are four main gate lines with a width of 1.1 mm, 102 sub-gate lines with a width of 40 μm, the distance between two adjacent sub-gate lines is 1.5 mm, and both the front electrode and the back electrode are formed by Heraeus SOL9360 type silver paste.

A preparation method of a solar cell according to the example is as follows.

Step 101, an N-type monocrystalline silicon wafer is cleaned (cleaning time is 2 minutes) with a mixed aqueous solution of NaOH and $H_2O_2$ (NaOH, $H_2O_2$ and $H_2O$ are mixed at a mass ratio of 0.5%:1%:98.5%), then a front surface of the N-type monocrystalline silicon wafer is textured with an aqueous solution of sodium hydroxide with a mass concentration of 3%, and after texturing, reflectivity of the front surface of the N-type monocrystalline silicon wafer is 12%.

Step 102, boron doping is performed on the textured front surface of the N-type monocrystalline silicon wafer by a furnace tube boron diffusion method to prepare an emitter layer, and a P—N junction is formed, wherein the furnace tube boron diffusion adopts a TS-81255 type diffusion furnace of the Tempress company, and diffusion conditions are as follows: introducing $BBr_3$ as a boron source into a quartz tube in the diffusion furnace at a temperature of 940° C. (input time is 20 min), then stopping the introduction of $BBr_3$, and keeping at 960° C. for 20 min.

Step 103, the diffused N-type monocrystalline silicon wafer is soaked for 5 min in a TMAH solution having a mass concentration of 20% at a temperature of 70° C., a back surface of the N-type monocrystalline silicon wafer is flattened, and then the silicon wafer is cleaned with an HF aqueous solution with mass concentration of 10% for 2 min.

Step 104, phosphorus ions are implanted into the back surface of the N-type monocrystalline silicon wafer using an iPV-2000 ion implantation machine of the Kingston company (Kingstone Semiconductor Joint Stock Company Ltd.), phosphorus doping is carried out to form an N-type surface field layer, and implantation conditions are as follows: an ion acceleration voltage is 10 kV, a beam current after acceleration is 120 mA, and a vacuum degree of an ion implantation chamber is $2 \times 10^{-5}$ Torr.

Step 105, a gallium oxide thin film is deposited on the emitter layer by a Plasma Enhanced Atomic Layer Deposition (PEALD) method, the device used is TFS 200 type atomic layer deposition thin film system of Beneq company, Finland, and deposition conditions are as follows: a temperature is 75° C., a pressure is 0.25 Torr, the volume flow rate of trimethyl gallium (TMGa) is 70 sccm (standard ml/min), and the volume flow rate of $O_2$ is 200 sccm.

Step 106, a silicon nitride thin film is formed on the emitter layer and the N-type surface field layer by a PECVD method, the device used is SINA type PECVD device of ROTH&RAU company, and deposition conditions are as follows: a temperature is 400° C., a pressure is 0.25 Torr, the volume flow rate of $SiH_4$ is 100 sccm, and the volume flow of $NH_3$ is 180 sccm.

Step 107, print the paste used for forming a back electrode by screen printing, and the screen printing machine used is a Baccini speedy thinking type printing machine (the same below) of the Applied materials company.

Step 108, print the paste used for forming a front electrode by screen printing.

Step 109, sintering is carried out at a temperature of 820° C., and the sintering time is 10 seconds; and after sintering, front metal silver passes through the silicon nitride/gallium oxide thin film to form a local ohmic contact with the emitter layer, and back silver paste corrodes the silicon nitride thin film to form an ohmic contact with an N-type doped layer.

Performance of the solar cell according to the example is tested (test condition is 25° C., and spectral condition is AM1.5) by I-V test method (a CetisPV-XF2-PB type I-V tester of Halm company, Germany), and the results are that: an open-circuit voltage is 0.668 V, a short circuit current is 9.77 A, and photovoltaic conversion efficiency is 21.1%.

EXAMPLE 2

The example provides an N-type crystalline silicon double-sided solar cell passivated by gallium oxide, and the difference between the solar cell according to the example and the solar cell according to example 1 is that a thickness of a gallium oxide layer in the solar cell according to the example is 1 nm.

Performance of the solar cell according to the example is tested according to the test method and the test condition in example 1, and the results are that: an open-circuit voltage is 0.661 V, a short circuit current is 9.79 A, and photovoltaic conversion efficiency is 20.92%.

EXAMPLE 3

The example provides an N-type crystalline silicon double-sided solar cell passivated by gallium oxide, and the difference between the solar cell according to the example and the solar cell according to example 1 is that a thickness of a gallium oxide layer in the solar cell according to the example is 40 nm.

Performance of the solar cell according to the example is tested according to the test method and the test condition in example 1, and the results are that: an open-circuit voltage is 0.668 V, a short circuit current is 9.75 A, and photovoltaic conversion efficiency is 21.06%.

EXAMPLE 4

The example provides an N-type crystalline silicon double-sided solar cell passivated by gallium oxide, and the difference between the solar cell according to the example and the solar cell according to example 1 is that a thickness of a gallium oxide layer in the solar cell according to the example is 80 nm.

Performance of the solar cell according to the example is tested according to the test method and the test condition in example 1, and the results are that: an open-circuit voltage is 0.668 V, a short circuit current is 9.73 A, and photovoltaic conversion efficiency is 20.69%.

EXAMPLE 5

The example provides an N-type crystalline silicon double-sided solar cell passivated by gallium oxide, and the difference between the solar cell according to the example and the solar cell according to example 1 is that a thickness of a gallium oxide layer in the solar cell according to the example is 120 nm.

Performance of the solar cell according to the example is tested according to the test method and the test condition in example 1, and the results are that: an open-circuit voltage is 0.667 V, a short circuit current is 9.58 A, and photovoltaic conversion efficiency is 19.87%.

Comparison Example 1

The comparison example provides an N-type crystalline silicon double-sided solar cell without a gallium oxide layer, and the difference between the solar cell according to the comparison example and the solar cell according to example 1 is that the gallium oxide layer is not arranged in the solar cell according to the comparison example. When the solar cell is prepared, a silicon nitride thin film is directly formed on an emitter layer.

Performance of the solar cell according to the comparison example is tested according to the test method and the test condition in example 1, and the results are that: an open-circuit voltage is 0.656 V, a short circuit current is 9.8 A, and photovoltaic conversion efficiency is 20.78%.

Comparison Example 2

The comparison example provides an N-type crystalline silicon double-sided solar cell passivated by zirconium oxide, and the difference between the solar cell according to the comparison example and the solar cell according to example 1 is that in the solar cell according to the comparison example, a zirconium oxide ($ZrO_x$) thin film is used instead of a gallium oxide thin film. When the solar cell is prepared, firstly, the zirconium oxide thin film is formed on an emitter layer, and then a silicon nitride thin film is formed on the zirconium oxide thin film.

Performance of the solar cell according to the comparison example is tested according to the test method and the test condition in example 1, and the results are that: an open-circuit voltage is 0.658 V, a short circuit current is 9.62 A, and photovoltaic conversion efficiency is 20.47%.

Comparison Example 3

The comparison example provides an N-type crystalline silicon double-sided solar cell passivated by tantalum oxide, and the difference between the solar cell according to the comparison example and the solar cell according to example 1 is that in the solar cell according to the comparison example, a tantalum oxide ($TaO_x$) thin film is used instead of a gallium oxide thin film. When the solar cell is prepared, firstly, the tantalum oxide thin film is formed on an emitter layer, and then a silicon nitride thin film is formed on the tantalum oxide thin film.

Performance of the solar cell according to the comparison example is tested according to the test method and the test condition in example 1, and the results are that: an open-circuit voltage is 0.66 V, a short circuit current is 9.68 A, and photovoltaic conversion efficiency is 20.66%.

Comparison Example 4

The comparison example provides an N-type crystalline silicon double-sided solar cell passivated by hafnium oxide, and the difference between the solar cell according to the comparison example and the solar cell according to example 1 is that in the solar cell according to the comparison example, a hafnium oxide ($HfO_x$) thin film is used instead of a gallium oxide thin film. When the solar cell is prepared, firstly, the hafnium oxide thin film is formed on an emitter layer, and then a silicon nitride thin film is formed on the hafnium oxide thin film.

Performance of the solar cell according to the comparison example is tested according to the test method and the test condition in example 1, and the results are that: an open-circuit voltage is 0.665 V, a short circuit current is 9.73 A, and photovoltaic conversion efficiency is 20.92%.

The performance testing results of the solar cells in the above-mentioned examples 1-5 and comparison examples 1-4 are summarized below in Table 1.

TABLE 1

Performance Testing Results of Solar Cells

| Sequence Number | Oxide Type | Thickness of Oxide Thin Film | Open-Circuit Voltage | Short Circuit Current | Photovoltaic Conversion Efficiency |
|---|---|---|---|---|---|
| example 1 | gallium oxide | 20 nm | 0.668 V | 9.77 A | 21.1% |
| example 2 | gallium oxide | 1 nm | 0.661 V | 9.79 A | 20.92% |
| example 3 | gallium oxide | 40 nm | 0.668 V | 9.75 A | 21.06% |
| example 4 | gallium oxide | 80 nm | 0.668 V | 9.73 A | 20.69% |
| example 5 | gallium oxide | 120 nm | 0.667 V | 9.58 A | 19.87% |
| Comparison example 1 | — | — | 0.656 V | 9.8 A | 20.78% |
| Comparison example 2 | zirconium oxide | 20 nm | 0.658 V | 9.62 A | 20.47% |
| Comparison example 3 | tantalum oxide | 20 nm | 0.66 V | 9.68 A | 20.66% |
| Comparison example 4 | hafnium oxide | 20 nm | 0.665 V | 9.73 A | 20.92% |

EXAMPLE 6

The example provides a Topcon solar cell passivated by gallium oxide, and as shown in FIG. 3, the solar cell includes a front electrode, a front covering layer, a gallium oxide layer, an emitter layer, an N-type crystalline silicon substrate, a tunneling passivation layer, a doped polycrystalline silicon layer, a back covering layer and a back electrode disposed in sequence from front to back.

The N-type crystalline silicon substrate is an N-type monocrystalline silicon wafer with resistivity of 2.0 Ω·cm and a size of 156.75 mm×156.75 mm The emitter layer is formed by furnace tube boron diffusion, and after doping, its sheet resistance value is 80 Ω/□.

A thickness of the gallium oxide layer is 20 nm.

The front covering layer is a silicon nitride layer, and has a thickness of 65 nm.

A thickness of the tunneling passivation layer is 1.8 nm; and a thickness of the doped polycrystalline silicon layer is 100 nm, the doped polycrystalline silicon layer is doped with phosphorus, and after doping, its sheet resistance is 38 Ω/□.

A back passivation layer is a silicon nitride layer, and has a thickness of 70 nm.

Both the front electrode and the back electrode are of gate line structures, wherein there are four main gate lines with a width of 1.1 mm, 102 sub-gate lines with a width of 40 μm, a distance between two adjacent sub-gate lines is 1.5 mm, the front electrode is formed of Heraeus SOL9360 type silver paste, and the back electrode is formed of Heraeus SOL9621 type silver paste.

A preparation method of a solar cell according to the example is as follows.

Step 601, an N-type monocrystalline silicon wafer is cleaned (cleaning time is 2 min) with a mixed aqueous solution of NaOH and $H_2O_2$ (NaOH, $H_2O_2$ and $H_2O$ are mixed at a mass ratio of 0.5%:1%:98.5%), then a front surface of the N-type monocrystalline silicon wafer is textured with an aqueous solution of sodium hydroxide with a mass concentration of 3%, and after texturing, reflectivity of the front surface of the N-type monocrystalline silicon wafer is 12%.

Step 602, boron doping is carried out on the textured front surface of the N-type monocrystalline silicon wafer by a furnace tube boron diffusion method to prepare an emitter layer, and a P—N junction is formed, wherein furnace tube boron diffusion adopts a TS-81255 type diffusion furnace of Tempress company, and diffusion conditions are that: introducing $BBr_3$ as a boron source into a quartz tube in the diffusion furnace at a temperature of 940° C. (input time is 20 min), then stopping the introduction of the $BBr_3$, and keeping at 960° C. for 20 min.

Step 603, the diffused N-type monocrystalline silicon wafer is soaked for 30s in a TMAH solution having a mass concentration of 20% at a temperature of 40° C., a back surface of the N-type monocrystalline silicon wafer is flattened, and then the silicon wafer is cleaned with an HF aqueous solution with mass concentration of 10% for 2 min.

Step 604, a tunneling passivation layer grows on a back surface of the N-type monocrystalline silicon wafer by a thermal oxidation method, and specific process parameters are that: in the oxygen atmosphere, a heating temperature is 610° C., and heating time is 2 min.

Step 605, an intrinsic polycrystalline silicon layer grows on the tunneling passivation layer by an LPCVD method, and the intrinsic polycrystalline silicon layer is doped with phosphorus by means of a phosphorus ion implantation to form a doped polycrystalline silicon layer.

A device for growing the intrinsic polycrystalline silicon layer is a 997-AAK type LPCVD device of Tempress company, and growth conditions are as follows: a temperature is 600° C., the volume flow rate of $SiH_4$ is 600 sccm, and a pressure is 0.25 Torr.

A device for phosphorus ion implantation is an iPV-2000 type ion implantation machine of Kingston company, and implantation conditions are as follows: an ion acceleration voltage is 10 kV, a beam current after acceleration is 120 mA, and a vacuum degree of an ion implantation chamber is $2 \times 10^{-5}$ Torr.

Step 606, a gallium oxide thin film is deposited on the emitter layer by a PEALD method, the device used is a TFS 200 type atomic layer deposition thin film system of Beneq company, Finland, and deposition conditions are as follows: a temperature is 75° C., a pressure is 0.25 Torr, the volume flow rate of trimethyl gallium (TMGa) is 70 sccm (standard ml/min), and the volume flow rate of $O_2$ is 200 sccm.

Step 607, a silicon nitride thin film is formed on the emitter layer and the doped polycrystalline silicon layer by PECVD, the device used is an SINA type PECVD device of ROTH&RAU company, and deposition conditions are as follows: a temperature is 400° C., a pressure is 0.25 mBar, the volume flow rate of $SiH_4$ is 100 sccm, and the volume flow rate of $NH_3$ is 180 sccm.

Step 608, print the paste used for forming a back electrode by screen printing, and the screen printing machine used is a Baccini speedy thinking type printing machine of Applied materials company.

Step 609, print the paste used for forming a front electrode by screen printing.

Step 610, sintering is carried out at a temperature of 820° C., and sintering time is 10 seconds; and after sintering, front metal silver passes through the silicon nitride/gallium oxide thin film to form a local ohmic contact with the emitter layer, and back silver paste corrodes the silicon nitride thin film to form an ohmic contact with the doped polycrystalline silicon layer.

Performance of the solar cell according to the example is tested according to the test method and the test condition in example 1, and the results are as follows: an open-circuit voltage is 0.689 V, a short circuit current is 9.98 A, and photovoltaic conversion efficiency is 22.23%.

EXAMPLE 7

The example provides a Topcon solar cell passivated by gallium oxide, and the difference between the solar cell according to the example and the solar cell according to example 6 is that a thickness of a gallium oxide layer in the solar cell according to the example is 1 nm.

Performance of the solar cell according to the example is tested according to the test method and the test condition in example 1, and the results are as follows: an open-circuit voltage is 0.687 V, a short circuit current is 9.99 A, and photovoltaic conversion efficiency is 22.19%.

EXAMPLE 8

The example provides a Topcon solar cell passivated by gallium oxide, and the difference between the solar cell according to the example and the solar cell according to example 6 is that a thickness of a gallium oxide layer in the solar cell according to the example is 40 nm.

Performance of the solar cell according to the example is tested according to the test method and the test condition in example 1, and the results are as follows: an open-circuit voltage is 0.688 V, a short circuit current is 9.896 A, and photovoltaic conversion efficiency is 22.01%.

EXAMPLE 9

The example provides a Topcon solar cell passivated by gallium oxide, and the difference between the solar cell according to the example and the solar cell according to example 6 is that a thickness of a gallium oxide layer in the solar cell according to the example is 80 nm.

Performance of the solar cell according to the example is tested according to the test method and the test condition in example 1, and the results are as follows: an open-circuit voltage is 0.688 V, a short circuit current is 9.73 A, and photovoltaic conversion efficiency is 21.64%.

EXAMPLE 10

The example provides a Topcon solar cell passivated by gallium oxide, and the difference between the solar cell according to the example and the solar cell according to example 6 is that a thickness of a gallium oxide layer in the solar cell according to the example is 120 nm.

Performance of the solar cell according to the example is tested according to the test method and the test condition in example 1, and the results are as follows: an open-circuit voltage is 0.688 V, a short circuit current is 9.48 A, and photovoltaic conversion efficiency is 20.77%.

Comparison Example 5

The comparison example provides a Topcon solar cell without a gallium oxide layer, and the difference between the solar cell according to the comparison example and the solar cell according to example 6 is that the gallium oxide layer is not arranged in the solar cell according to the comparison example. When the solar cell is prepared, a silicon nitride thin film is directly formed on an emitter layer.

Performance of the solar cell according to the comparison example is tested according to the test method and the test condition in example 1, and the results are as follows: an open-circuit voltage is 0.682 V, a short circuit current is 9.99 A, and photovoltaic conversion efficiency is 22.03%.

Comparison Example 6

The comparison example provides a Topcon solar cell passivated by zirconium oxide, and the difference between the solar cell according to the comparison example and the solar cell according to example 6 is that in the solar cell according to the comparison example, a zirconium oxide ($ZrO_x$) thin film is used instead of a gallium oxide thin film. When the solar cell is prepared, firstly, the zirconium oxide thin film is formed on an emitter layer, and then a silicon nitride thin film is formed on the zirconium oxide thin film.

Performance of the solar cell according to the comparison example is tested according to the test method and the test condition in example 1, and the results are as follows: an open-circuit voltage is 0.680 V, a short circuit current is 9.86 A, and photovoltaic conversion efficiency is 21.68%.

Comparison Example 7

The comparison example provides a Topcon solar cell passivated by tantalum oxide, and the difference between the solar cell according to the comparison example and the solar cell according to example 6 is that in the solar cell according to the comparison example, a tantalum oxide ($TaO_x$) thin film is used instead of a gallium oxide thin film. When the solar cell is prepared, firstly, the tantalum oxide thin film is formed on an emitter layer, and then a silicon nitride thin film is formed on the tantalum oxide thin film.

Performance of the solar cell according to the comparison example is tested according to the test method and the test condition in example 1, and the results are as follows: an open-circuit voltage is 0.682 V, a short circuit current is 9.97 A, and photovoltaic conversion efficiency is 21.99%.

Comparison Example 8

The comparison example provides a Topcon solar cell passivated by hafnium oxide, and the difference between the solar cell according to the comparison example and the solar cell according to example 6 is that in the solar cell according to the comparison example, a hafnium oxide ($HfO_x$) thin film is used instead of a gallium oxide thin film. When the solar cell is prepared, firstly, the hafnium oxide thin film is formed on an emitter layer, and then a silicon nitride thin film is formed on the hafnium oxide thin film.

Performance of the solar cell according to the comparison example is tested according to the test method and the test condition in example 1, and the results are as follows: an open-circuit voltage is 0.684 V, a short circuit current is 9.95 A, and photovoltaic conversion efficiency is 22.0%.

The performance testing results of the solar cells in the above-mentioned examples 6-10 and comparison examples 5-8 are summarized below in Table 2.

TABLE 2

Performance Testing Results of Solar Cells

| Sequence Number | Oxide Type | Thickness of Oxide Thin Film | Open-Circuit Voltage | Short Circuit Current | Photovoltaic Conversion Efficiency |
|---|---|---|---|---|---|
| Example 6 | gallium oxide | 20 nm | 0.689 V | 9.98 A | 22.23% |
| Example 7 | gallium oxide | 1 nmer | 0.687 V | 9.99 A | 22.19% |
| Example 8 | gallium oxide | 40 nm | 0.688 V | 9.896 A | 22.01% |
| Example 9 | gallium oxide | 80 nm | 0.688 V | 9.73 A | 21.64% |
| Example 10 | gallium oxide | 120 nm | 0.688 V | 9.48 A | 20.77% |
| Comparison example 5 | — | — | 0.682 V | 9.99 A | 22.03% |
| Comparison example 6 | zirconium oxide | 20 nm | 0.680 V | 9.86 A | 21.68% |
| Comparison example 7 | tantalum oxide | 20 nm | 0.682 V | 9.97 A | 21.99% |
| Comparison example 8 | hafnium oxide | 20 nm | 0.684 V | 9.95 A | 22.0% |

EXAMPLE 11

The example provides a crystalline silicon PERC with full-aluminum back-surface-field solar cell passivated by gallium oxide, and as shown in FIG. 4, the solar cell includes a front electrode, a front covering layer, an emitter layer, a P-type crystalline silicon substrate, a gallium oxide layer, a back covering layer and a back electrode disposed in sequence from front to back.

The P-type crystalline silicon substrate is a P-type monocrystalline silicon wafer with resistivity of 2.0 Ω·cm and a size of 156.75 mm×156.75 mm A thickness of the gallium oxide layer is 40 nm.

The back covering layer is a silicon nitride layer, and has a thickness of 70 nm.

142×142 (i.e., 142 via holes on each row, and 142 rows in total) round via holes are correspondingly formed in the gallium oxide layer and the back covering layer, an aperture of each via hole is 50 μm, and a spacing between two adjacent via holes (a distance between circle centers) is 1,100 μm.

The back electrode includes a first part and a second part, wherein the first part is linear, and is used for conduction convergence and series welding of the solar cell and is formed of PV56x type silver paste of Dupant company, its number is 4 and the width is 1.6 mm; and the second part is aluminum electrode formed by PV36x type aluminum paste of Dupant company and covers all regions on the back covering layer except the first part, and the second part passes through the via holes to be in contact with the P-type crystalline silicon substrate.

The front electrode is of a gate line structure, and is formed of Heraeus SOL9621 type silver paste, wherein there are four main gate lines with a width of 1.1 mm, and 102 sub-gate lines with a width of 40 μm, a spacing of 1.5 mm.

The front covering layer is a silicon nitride layer, and has a thickness of 80 nm.

The emitter layer is formed by furnace tube phosphorus diffusion, and after doping, its sheet resistance value is 100 Ω/□.

A preparation method of a solar cell according to the example, is as follows:

Step 1101, a P-type monocrystalline silicon wafer is cleaned (cleaning time is 2 min) with a mixed aqueous solution of NaOH and $H_2O_2$ (NaOH, $H_2O_2$ and $H_2O$ are mixed at a mass ratio of 0.5%:1%:98.5%), then a front surface of the P-type monocrystalline silicon wafer is textured with an aqueous solution of sodium hydroxide having a mass concentration of 3%, and after texturing, reflectivity of the front surface of the P-type monocrystalline silicon wafer is 12%.

Step 1102, phosphorus doping is performed on the textured front surface of the P-type monocrystalline silicon wafer by a furnace tube phosphorus diffusion method to prepare an emitter layer, and a P—N junction is formed, wherein furnace tube phosphorus diffusion adopts an L4511II-40/ZM type diffusion device of SevenStart company, and diffusion conditions are as follows: introducing $POCl_3$ as a phosphorus source into a quartz tube at a temperature of 820° C. (input time is 20 min), then stopping the introduction of the $POCl_3$, and keeping at 840° C. for 20 min.

Step 1103, the diffused P-type monocrystalline silicon wafer is soaked for 5 min in a TMAH solution with a mass concentration of 20% at a temperature of 70° C., a back surface of the P-type monocrystalline silicon wafer is flattened, and then the silicon wafer is cleaned with an HF aqueous solution with a mass concentration of 10% for 2 min.

Step 1104, a gallium oxide thin film is deposited on a back surface of the P-type monocrystalline silicon wafer by PEALD method, the device used is a TFS 200 type atomic layer deposition thin film system of Beneq company, Finland, and deposition conditions are as follows: a temperature is 75° C., a pressure is 0.25 Torr, the volume flow rate of trimethyl gallium (TMGa) is 70 sccm (standard ml/min), and the volume flow rate of $O_2$ is 200 sccm.

Step 1105, a silicon nitride thin film is formed on the emitter layer on the front surface of the P-type monocrystalline silicon wafer and the gallium oxide thin film on the back surface of the P-type monocrystalline silicon wafer by PECVD method, the device used is an SINA type PECVD device of the ROTH&RAU company, and deposition conditions are as follows: a temperature is 400° C., a pressure is 0.25 mBar, the volume flow rate of $SiH_4$ is 100 sccm, and the volume flow rate of $NH_3$ is 180 sccm.

Step 1106, perforation is performed on a gallium oxide/silicon nitride lamination structure on the back surface of the P-type monocrystalline silicon wafer using laser.

Step 1107, print the paste used for forming the first part in the back electrode by screen printing, and the screen printing machine used is Baccini speedy thinking type printing machine of Applied materials company.

Step 1108, print the paste used for forming the second part in the back electrode by screen printing.

Step 1109, print the paste used for forming the front electrode by screen printing.

Step 1110, sintering is carried out at a temperature of 790° C., the sintering time is 10 seconds; and after sintering, front metal silver partially burns through the silicon nitride thin film to form an ohmic contact with the emitter layer, and back aluminum particles and a silicon substrate corresponding to a via hole region form an aluminum-silicon alloy and an aluminum back surface field.

Performance of the solar cell according to the example is tested according to the test method and the test condition in example 1, and the results are as follows: an open-circuit voltage is 0.668 V, a short circuit current is 9.71 A, and photovoltaic conversion efficiency is 20.73%.

EXAMPLE 12

The example provides a crystalline silicon PERC partial-aluminum back-surface-field solar cell passivated by gallium oxide, and as shown in FIG. 5, the difference between a structure of the solar cell and a structure of the solar cell according to example 11 is that a partial region of a back covering layer is not covered by the second part formed by aluminum paste, of a back electrode.

The second part of the back electrode is linear, there are 102 second parts in total, and each second part has a width of 70 μm, the distance between two adjacent second parts is 1.1 mm, and the second part is perpendicular to the first part for conduction convergence and series welding.

Performance of the solar cell according to the example is tested according to the test method and the test condition in example 1, and the results are as follows: an open-circuit voltage is 0.668 V, a short circuit current is 9.78 A, and photovoltaic conversion efficiency is 20.83%.

EXAMPLE 13

The example provides a crystalline silicon PERC partial-aluminum back-surface-field solar cell passivated by gallium oxide, and the difference between the solar cell according to the example and the solar cell according to example 12 is that a thickness of a gallium oxide layer in the solar cell according to the example is 1 nm.

Performance of the solar cell according to the example is tested according to the test method and the test condition in example 1, and the results are as follows: an open-circuit voltage is 0.647 V, a short circuit current is 9.1 A, and photovoltaic conversion efficiency is 19.04%.

EXAMPLE 14

The example provides a crystalline silicon PERC partial-aluminum back-surface-field solar cell passivated by gallium oxide, and the difference between the solar cell according to the example and the solar cell according to example 12 is that a thickness of a gallium oxide layer in the solar cell according to the example is 80 nm.

Performance of the solar cell according to the example is tested according to the test method and the test condition in example 1, and the results are as follows: an open-circuit voltage is 0.667 V, a short circuit current is 9.7 A, and photovoltaic conversion efficiency is 20.60%.

EXAMPLE 15

The example provides a crystalline silicon PERC partial-aluminum back-surface-field solar cell passivated by gallium oxide, and the difference between the solar cell according to the example and the solar cell according to example 12 is that a thickness of a gallium oxide layer in the solar cell according to the example is 200 nm.

Performance of the solar cell according to the example is tested according to the test method and the test condition in example 1, and the results are as follows: an open-circuit voltage is 0.666 V, a short circuit current is 9.68 A, and photovoltaic conversion efficiency is 20.39%.

EXAMPLE 16

The example provides a crystalline silicon PERC partial-aluminum back-surface-field solar cell passivated by a gallium oxide, and the difference between the solar cell according to the example and the solar cell according to example 12 is that a thickness of a gallium oxide layer in the solar cell according to the example is 500 nm.

Performance of the solar cell according to the example is tested according to the test method and the test condition in example 1, and the results are that: an open-circuit voltage is 0.663 V, a short circuit current is 9.51 A, and photovoltaic conversion efficiency is 19.48%.

EXAMPLE 17

The example provides a crystalline silicon PERC partial-aluminum back-surface-field solar cell passivated by gallium oxide, and the difference between the solar cell according to the example and the solar cell according to example 12 is that a thickness of a gallium oxide layer in the solar cell according to the example is 1,000 nm.

Performance of the solar cell according to the example is tested according to the test method and the test condition in example 1, and the results are as follows: an open-circuit voltage is 0.660 V, a short circuit current is 9.52 A, and photovoltaic conversion efficiency is 18.82%.

Comparison Example 9

The comparison example provides a crystalline silicon PERC partial-aluminum back-surface-field solar cell without a gallium oxide layer, and the difference between the solar cell according to the comparison example and the solar cell according to example 12 is that the gallium oxide layer is not arranged in the solar cell according to the comparison example. When the solar cell is prepared, a silicon nitride thin film is directly formed on a back surface of a P-type monocrystalline silicon wafer.

Performance of the solar cell according to the comparison example is tested according to the test method and the test condition in example 1, and the results are as follows: an open-circuit voltage is 0.642 V, a short circuit current is 8.50 A, and photovoltaic conversion efficiency is 17.29%.

Comparison Example 10

The comparison example provides a crystalline silicon PERC partial-aluminum back-surface-field solar cell passivated by zirconium oxide, and the difference between the solar cell according to the comparison example and the solar cell according to example 12 is that in the solar cell according to the comparison example, a zirconium oxide ($ZrO_x$) thin film is used instead of a gallium oxide thin film. When the solar cell is prepared, firstly, the zirconium oxide thin film is formed on a back surface of a P-type monocrystalline silicon wafer, and then a silicon nitride thin film is formed on the zirconium oxide thin film.

Performance of the solar cell according to the comparison example is tested according to the test method and the test condition in example 1, and the results are as follows: an open-circuit voltage is 0.658 V, a short circuit current is 9.53 A, and photovoltaic conversion efficiency is 20.04%.

Comparison Example 11

The comparison example provides a crystalline silicon PERC partial-aluminum back-surface-field solar cell passivated by tantalum oxide, and the difference between the solar cell according to the comparison example and the solar cell according to example 12 is that in the solar cell according to the comparison example, a tantalum oxide ($TaO_x$) thin film is used instead of a gallium oxide thin film. When the solar cell is prepared, firstly, the tantalum oxide thin film is formed on a back surface of a P-type monocrystalline silicon wafer, and then a silicon nitride thin film is formed on the tantalum oxide thin film.

Performance of the solar cell according to the comparison example is tested according to the test method and the test condition in example 1, and the results are as follows: an open-circuit voltage is 0.660 V, a short circuit current is 9.63 A, and photovoltaic conversion efficiency is 20.32%.

Comparison Example 12

The comparison example provides a crystalline silicon PERC partial-aluminum back-surface-field solar cell passivated by hafnium oxide, and the difference between the solar cell according to the comparison example and the solar cell according to example 12 is that in the solar cell according to the comparison example, a hafnium oxide ($HfO_x$) thin film is used instead of a gallium oxide thin film. When the solar cell is prepared, firstly, the hafnium oxide thin film is formed on a back surface of a P-type monocrystalline silicon wafer, and then a $SiN_x$ thin film is formed on the hafnium oxide thin film.

Performance of the solar cell according to the comparison example is tested according to the test method and the test condition in example 1, and the results are as follows:

an open-circuit voltage is 0.665 V, a short circuit current is 9.65 A, and photovoltaic conversion efficiency is 20.51%.

The performance testing results of the solar cells in the above-mentioned examples 11-17 and comparison examples 9-12 are summarized below in Table 3.

TABLE 3

| | Performance Testing Results of Solar Cells | | | | |
|---|---|---|---|---|---|
| Sequence Number | Oxide Type | Thickness of Oxide Thin Film | Open-Circuit Voltage | Short Circuit Current | Photovoltaic Conversion Efficiency |
| Example 11 | gallium oxide | 40 nm | 0.668 V | 9.71 A | 20.73% |
| Example 12 | gallium oxide | 40 nm | 0.668 V | 9.78 A | 20.83% |

TABLE 3-continued

Performance Testing Results of Solar Cells

| Sequence Number | Oxide Type | Thickness of Oxide Thin Film | Open-Circuit Voltage | Short Circuit Current | Photovoltaic Conversion Efficiency |
|---|---|---|---|---|---|
| Example 13 | gallium oxide | 1 nm | 0.647 V | 9.1 A | 19.04% |
| Example 14 | gallium oxide | 80 nm | 0.667 V | 9.7 A | 20.60% |
| Example 15 | gallium oxide | 200 nm | 0.666 V | 9.68 A | 20.39% |
| Example 16 | gallium oxide | 500 nm | 0.663 V | 9.51 A | 19.48% |
| Example 17 | gallium oxide | 1,000 nm | 0.660 V | 9.52 A | 18.82% |
| Comparison example 9 | — | — | 0.642 V | 8.50 A | 17.29% |
| Comparison example 10 | zirconium oxide | 40 nm | 0.658 V | 9.53 A | 20.04% |
| Comparison example 11 | tantalum oxide | 40 nm | 0.660 V | 9.63 A | 20.32% |
| Comparison example 12 | hafnium oxide | 40 nm | 0.665 V | 9.65 A | 20.51% |

EXAMPLE 18

The example provides a crystalline silicon solar cell passivated by gallium oxide, and as shown in FIG. 9, the solar cell includes: a P-type crystalline silicon substrate; an emitter layer arranged on a front surface of the P-type crystalline silicon substrate; a front covering layer arranged on the emitter layer; a front electrode arranged on the front covering layer; a back tunneling passivation layer arranged on a back surface of the P-type crystalline silicon substrate; a back doped polycrystalline silicon layer arranged at a region, corresponding to a back electrode, on the back tunneling passivation layer, and doped with a boron element; a gallium oxide layer arranged on the back doped polycrystalline silicon layer and at a region of the back tunneling passivation layer where the back doped polycrystalline silicon layer is not arranged; a back covering layer arranged on the gallium oxide; and the back electrode arranged on the back covering layer.

The P-type crystalline silicon substrate is a P-type monocrystalline silicon wafer with resistivity of 2.0 Ω·cm and a size of 156.75 mm×156.75 mm;

a sheet resistance value of the emitter layer is 80 Ω/□;

the front covering layer is a silicon nitride layer, and has a thickness of 80 nm;

the front electrode is of a gate line structure, and is formed of Heraeus SOL9621 type silver paste, wherein there are four main gate lines with a width of 1.1 mm, and 102 sub-gate lines with a width of 40 microns, and a spacing of 1.5 mm;

the back tunneling passivation layer is a silicon oxide layer, and has a thickness of 1.9 nm;

the back doped polycrystalline silicon layer has a thickness of 200 nm;

the gallium oxide layer has a thickness of 20 nm;

the back covering layer is a silicon nitride layer, and has a thickness of 80 nm; and the back electrode is also of a gate line structure, and is formed of Heraeus SOL9360 type silver paste, wherein there are four main gate lines with a width of 1.1 mm, and 102 sub-gate lines with a width of 40 microns, a spacing of 1.5 mm A preparation method of a solar cell according to the example, is as follows:

Step 1801, a P-type monocrystalline silicon wafer is cleaned (cleaning time is 2 min) with a mixed aqueous solution of NaOH and $H_2O_2$ (NaOH, $H_2O_2$ and $H_2O$ are mixed at a mass ratio of 0.5%:1%:98.5%), then a front surface of the P-type monocrystalline silicon wafer is textured with an aqueous solution of sodium hydroxide having a mass concentration of 3%, and after texturing, reflectivity of the front surface of the P-type monocrystalline silicon wafer is 12%.

Step 1802, phosphorus doping is performed on the textured front surface of the P-type monocrystalline silicon wafer by a furnace tube phosphorus diffusion method to prepare an emitter layer, and a P—N junction is formed, wherein furnace tube phosphorus diffusion adopts an L4511II-40/ZM type diffusion device of SevenStart company, and diffusion conditions are as follows: introducing $POCl_3$ as a phosphorus source into a quartz tube at a temperature of 820° C. (input time is 20 min), then stopping the introduction of the $POCl_3$, and keeping at 840° C. for 20 min Step 1803, the diffused P-type monocrystalline silicon wafer is soaked for 5 min in a TMAH solution with a mass concentration of 20% at a temperature of 70° C., a back surface of the P-type monocrystalline silicon wafer is flattened, and then the silicon wafer is cleaned with an HF aqueous solution with a mass concentration of 10% for 2 min.

Step 1804, a silicon oxide thin film grows on a back surface of the P-type monocrystalline silicon wafer by a furnace tube thermal oxidation method and is used as a back tunneling passivation layer, process conditions are as follows: in the oxygen atmosphere, a heating temperature is 610° C., and heating time is 2 min.

Step 1805, an intrinsic polycrystalline silicon thin film grows on the back tunneling passivation layer by LPCVD method, and the intrinsic polycrystalline silicon thin film is doped with boron by boron ion implantation to form a back doped polycrystalline silicon layer.

A device for growing the polycrystalline silicon thin film is a 997-AAK type LPCVD device of Tempress company, and growth conditions are as follows: a temperature is 600° C., the volume flow rate of $SiH_4$ is 600 sccm, and a pressure is 0.25 Torr.

A device for boron ion implantation is an iPV-2000 type ion implantation machine of Kingston company, and implantation conditions are as follows: an ion acceleration voltage is 10 kV, a beam current after acceleration is 120 mA, and a vacuum degree of an ion implantation chamber is $2\times10^{-5}$ Torr.

Step 1806, a region, corresponding to a back electrode, of the back doped polycrystalline silicon layer, is irradiated by laser scanning, and a BSG protective layer is formed at the region, corresponding to the back electrode, of the back doped polycrystalline silicon layer, wherein a pattern of laser scanning is the same as a pattern of the back electrode, the laser used is nanosecond laser, and laser energy is 20 watts.

Step 1807, a region, which is not covered by the BSG protective layer, of the back doped polycrystalline silicon layer is removed by an alkali solution, and thus the back doped polycrystalline silicon layer with the same pattern as the back electrode is formed (wherein the alkali solution is Tetramethylammonium hydroxide solution with a mass concentration of 7%, and cleaning is carried out for 5 min at a temperature of 50° C.), and then the BSG protective layer is removed by hydrofluoric acid (wherein the mass concentration of the hydrofluoric acid is 5%, and cleaning is carried out for 2 min at the room temperature).

Step 1808, a gallium oxide thin film is formed on the back doped polycrystalline silicon layer obtained in the step S1807 and the region of the back tunneling passivation layer where the doped polycrystalline silicon layer is not arranged, by an ALD process, and deposition conditions are as follows: a temperature is 75° C., a pressure is 0.25 Torr, the volume flow rate of trimethyl gallium (TMGa) is 70 sccm (standard ml/min), and the volume flow rate of $O_2$ is 200 sccm.

Step 1809, a silicon nitride thin film is formed on the emitter layer and the gallium oxide layer, the device used is an SINA type PECVD device of ROTH&RAU company, and deposition conditions are as follows: a temperature is 400° C., a pressure is 0.25 mBar, the volume flow rate of $SiH_4$ is 100 sccm, and the volume flow rate of $NH_3$ is 180 sccm.

Step 1810, print the silver paste used for forming the back electrode by screen printing, and the screen printing machine used is Baccini speedy thinking type printing machine (the same blow) of Applied materials company.

Step 1811, print the silver paste used for forming a front electrode by screen printing.

Step 1812, sintering is carried out at a temperature of 820° C., and the sintering time is 10 seconds; in the sintering process, the front silver paste corrodes the front silicon nitride layer, so that the front silver electrode passes through the front silicon nitride layer to form an ohmic contact with the emitter layer; and the back silver paste corrodes a silicon nitride covering layer 5 and a gallium oxide layer 4, so that the back metal electrode passes through a silicon nitride/gallium oxide lamination structure to form an ohmic contact with the boron doped polycrystalline silicon layer.

Performance of the solar cell according to the example is tested according to the test method and the test condition in example 1, and the results are as follows: an open-circuit voltage is 0.668 V, a short circuit current is 9.74 A, and photovoltaic conversion efficiency is 20.76%.

EXAMPLE 19

The example provides a crystalline silicon solar cell passivated by gallium oxide, and the difference between the solar cell according to the example and the solar cell according to example 18 is that a thickness of a gallium oxide layer in the solar cell according to the example is 10 nm.

Performance of the solar cell according to the example is tested according to the test method and the test condition in example 1, and the results are as follows: an open-circuit voltage is 0.660 V, a short circuit current is 9.72 A, and photovoltaic conversion efficiency is 20.24%.

EXAMPLE 20

The example provides a crystalline silicon solar cell passivated by gallium oxide, and the difference between the solar cell according to the example and the solar cell according to example 18 is that a thickness of a gallium oxide layer in the solar cell according to the example is 40 nm.

Performance of the solar cell according to the example is tested according to the test method and the test condition in example 1, and the results are as follows: an open-circuit voltage is 0.669 V, a short circuit current is 9.81 A, and photovoltaic conversion efficiency is 20.87%.

EXAMPLE 21

The example provides a crystalline silicon solar cell passivated by gallium oxide, and the difference between the solar cell according to the example and the solar cell according to example 18 is that a thickness of a gallium oxide layer in the solar cell according to the example is 60 nm.

Performance of the solar cell according to the example is tested according to the test method and the test condition in example 1, and the results are as follows: an open-circuit voltage is 0.669 V, a short circuit current is 9.79 A, and photovoltaic conversion efficiency is 20.68%.

EXAMPLE 22

The example provides a crystalline silicon solar cell passivated by gallium oxide, and the difference between the solar cell according to the example and the solar cell according to example 18 is that a thickness of a gallium oxide layer in the solar cell according to the example is 75 nm.

Performance of the solar cell according to the example is tested according to the test method and the test condition in example 1, and the results are as follows: an open-circuit voltage is 0.668 V, a short circuit current is 9.78 A, and photovoltaic conversion efficiency is 20.58%.

EXAMPLE 23

The example provides a crystalline silicon solar cell passivated by gallium oxide, and the difference between the solar cell according to the example and the solar cell according to example 18 is that a thickness of a gallium oxide layer in the solar cell according to the example is 90 nm.

Performance of the solar cell according to the example is tested according to the test method and the test condition in example 1, and the results are as follows: an open-circuit voltage is 0.668 V, a short circuit current is 9.78 A, and photovoltaic conversion efficiency is 20.49%.

Comparison Example 13

The comparison example provides a crystalline silicon solar cell without a gallium oxide layer, and the difference between the solar cell according to the comparison example and the solar cell according to example 18 is that the gallium oxide layer is not arranged in the solar cell according to the comparison example. When the solar cell is prepared, a silicon nitride thin film as a back covering layer is directly formed on a back doped polycrystalline silicon layer and a region of a back tunneling passivation layer where the doped polycrystalline silicon layer is not arranged, on a back surface of a P-type crystalline silicon.

Performance of the solar cell according to the comparison example is tested according to the test method and the test condition in example 1, and the results are as follows: an open-circuit voltage is 0.642 V, a short circuit current is 8.5 A, and photovoltaic conversion efficiency is 17.29%.

Comparison Example 14

The comparison example provides a crystalline silicon solar cell passivated by zirconium oxide ($ZrO_x$), and the difference between the solar cell according to the comparison example and the solar cell according to example 18 is that in the solar cell according to the comparison example, a zirconium oxide thin film is used instead of a gallium oxide thin film. When the solar cell is prepared, firstly, the zirconium oxide thin film is formed on a back doped polycrystalline silicon layer and a region of a back tunneling passivation layer where the doped polycrystalline silicon layer is not arranged, on a back surface of a P-type crystalline silicon substrate, and then a silicon nitride thin film is formed on the zirconium oxide thin film.

Performance of the solar cell according to the comparison example is tested according to the test method and the test condition in example 1, and the results are as follows: an open-circuit voltage is 0.660 V, a short circuit current is 9.54 A, and photovoltaic conversion efficiency is 20.08%.

Comparison Example 15

The comparison example provides a crystalline silicon solar cell passivated by a tantalum oxide ($TaO_x$), and the difference between the solar cell according to the comparison example and the solar cell according to example 18 is that in the solar cell according to the comparison example, a tantalum oxide thin film is used instead of a gallium oxide thin film. When the solar cell is prepared, firstly, the tantalum oxide thin film is formed on a back doped polycrystalline silicon layer and a region of a back tunneling passivation layer where the doped polycrystalline silicon layer is not arranged, on a back surface of a P-type crystalline silicon substrate, and then a silicon nitride thin film is formed on the tantalum oxide thin film.

Performance of the solar cell according to the comparison example is tested according to the test method and the test condition in example 1, and the results are as follows: an open-circuit voltage is 0.661 V, a short circuit current is 9.64 A, and photovoltaic conversion efficiency is 20.39%.

Comparison Example 16

The comparison example provides a crystalline silicon solar cell passivated by a hafnium oxide ($HfO_x$), and the difference between the solar cell according to the comparison example and the solar cell according to example 18 is that in the solar cell according to the comparison example, a hafnium oxide thin film is used instead of a gallium oxide thin film. When the solar cell is prepared, firstly, the hafnium oxide thin film is formed on a back doped polycrystalline silicon layer and a region of a back tunneling passivation layer where the doped polycrystalline silicon layer is not arranged, on a back surface of a P-type crystalline silicon substrate, and then a silicon nitride thin film is formed on the hafnium oxide thin film.

Performance of the solar cell according to the comparison example is tested according to the test method and the test condition in example 1, and the results are as follows: an open-circuit voltage is 0.668 V, a short circuit current is 9.67 A, and photovoltaic conversion efficiency is 20.62%.

The performance testing results of the solar cells in examples 18-23 and comparison examples 13-16 above are summarized below in Table 4.

TABLE 4

Performance Testing Results of Solar Cells

| Sequence Number | Oxide Type | Thickness of Oxide Thin Film | Open-Circuit Voltage | Short Circuit Current | Photovoltaic Conversion Efficiency |
|---|---|---|---|---|---|
| Example 18 | gallium oxide | 20 nm | 0.668 V | 9.74 A | 20.76% |
| Example 19 | gallium oxide | 10 nm | 0.660 V | 9.72 A | 20.24% |
| Example 20 | gallium oxide | 40 nm | 0.669 V | 9.81 A | 20.87% |
| Example 21 | gallium oxide | 60 nm | 0.669 V | 9.79 A | 20.68% |
| Example 22 | gallium oxide | 75 nm | 0.668 V | 9.78 A | 20.58% |
| Example 23 | gallium oxide | 90 nm | 0.668 V | 9.78 A | 20.49% |
| Comparison example 13 | — | — | 0.642 V | 8.5 A | 17.29% |
| Comparison example 14 | zirconium oxide | 20 nm | 0.660 V | 9.54 A | 20.08% |
| Comparison example 15 | tantalum oxide | 20 nm | 0.661 V | 9.64 A | 20.39% |
| Comparison example 16 | hafnium oxide | 20 nm | 0.668 V | 9.67 A | 20.62% |

It can be seen from test data of the above-mentioned examples and comparison examples that compared to cases in which the gallium oxide layer is not arranged and other oxides instead of the gallium oxide are used for passivating, using the gallium oxide for passivating on the P-type silicon surface facilitates improvement of the photovoltaic conversion efficiency of the crystalline silicon solar cell.

The above is merely to facilitate understanding the technical solutions of the present disclosure by those skilled in the art, but not intended to limit the present disclosure. Any modifications, equivalent replacements, improvements and the like within the spirit and principle of the present disclosure shall fall within the scope of protection of the present disclosure.

The invention claimed is:
1. A crystalline silicon solar cell, comprising
   a crystalline silicon substrate having a P-type conductivity,
   a first tunneling passivation layer arranged on a surface of one side of the crystalline silicon substrate,
   a first doped silicon layer arranged on the first tunneling passivation layer and having the p-type conductivity,
   a gallium oxide layer arranged on the first doped silicon layer and in direct contact with the first doped silicon layer,
   a first covering layer arranged on the gallium oxide layer, and
   a first electrode arranged on the first covering layer and in contact with the first doped silicon layer;
   wherein the first doped silicon layer covers a partial region of the first tunneling passivation layer, and the gallium oxide layer is also arranged at a region of the first tunneling passivation layer where the first doped silicon layer is not arranged.
2. The crystalline silicon solar cell according to claim 1, characterized in that the crystalline silicon solar cell further comprises:
   an emitter layer arranged on a surface of another side, opposite to the first tunneling passivation layer, of the crystalline silicon substrate, and having an N-type conductivity,
   a second covering layer arranged on the emitter layer, and a second electrode arranged on the second covering layer and in contact with the emitter layer.

3. The crystalline silicon solar cell according to claim 1, characterized in that the crystalline silicon solar cell further comprises:
- an emitter layer arranged on a surface of another side, opposite to the first tunneling passivation layer, of the crystalline silicon substrate, and having an N-type conductivity,
- a second tunneling passivation layer arranged on the emitter layer,
- a second doped silicon layer arranged on the second tunneling passivation layer and having an N-type conductivity,
- a second covering layer arranged on the second doped silicon layer, and
- a second electrode arranged on the second covering layer and in contact with the second doped silicon layer;
- wherein the second doped silicon layer covers a partial region of the second tunneling passivation layer, and the second covering layer is also arranged at a region of the second tunneling passivation layer where the second doped silicon layer is not arranged.

4. The crystalline silicon solar cell according to claim 1, characterized in that the gallium oxide layer has a thickness of 10-90 nm.

5. A photovoltaic module, comprising a cover plate, a first encapsulant film, a cell string, a second encapsulant film and a backplane disposed in sequence, the cell string comprises a plurality of solar cells, and each of the plurality of the solar cells is the crystalline silicon solar cell according to claim 1.

* * * * *